(12) United States Patent
Tsugawa et al.

(10) Patent No.: US 8,143,858 B2
(45) Date of Patent: Mar. 27, 2012

(54) ELECTRICAL APPARATUS, ELECTRICAL APPARATUS SYSTEM, AND POWER SUPPLY APPARATUS

(75) Inventors: Shuichi Tsugawa, Kyoto (JP); Takeshi Nabesaka, Kyoto (JP)

(73) Assignee: Nintendo Co., Ltd., Kyoto (JP)

( * ) Notice: Subject to any disclaimer, the term of this patent is extended or adjusted under 35 U.S.C. 154(b) by 1224 days.

(21) Appl. No.: 11/656,940

(22) Filed: Jan. 24, 2007

(65) Prior Publication Data

US 2007/0176578 A1 Aug. 2, 2007

(30) Foreign Application Priority Data

Jan. 30, 2006 (JP) ................................ 2006-020467
Nov. 27, 2006 (JP) ................................ 2006-318854

(51) Int. Cl.
*H02J 7/00* (2006.01)
*H02H 3/00* (2006.01)
*H02J 7/04* (2006.01)
*G08B 21/00* (2006.01)
*H02H 5/00* (2006.01)
*H02H 7/122* (2006.01)

(52) U.S. Cl. ........ 320/134; 320/136; 320/149; 320/155; 340/636.12; 340/636.13; 361/74; 361/94; 361/97; 363/56.03

(58) Field of Classification Search ................. 320/134, 320/136, 149, 155; 340/636.12, 636.13; 363/56.03; 361/74, 94, 97
See application file for complete search history.

(56) References Cited

U.S. PATENT DOCUMENTS

| | | | |
|---|---|---|---|
| 5,914,586 A | 6/1999 | Fujita et al. | |
| 6,172,482 B1 * | 1/2001 | Eguchi | 320/134 |
| 7,006,365 B2 * | 2/2006 | Kitano | 363/56.03 |
| 7,394,223 B2 * | 7/2008 | Lai et al. | 320/134 |
| 7,495,416 B2 * | 2/2009 | Sato et al. | 320/134 |
| 2005/0127879 A1 * | 6/2005 | Sato et al. | 320/134 |

FOREIGN PATENT DOCUMENTS

| | | |
|---|---|---|
| JP | 10-69320 | 3/1998 |
| JP | 2000-050506 | 2/2000 |
| JP | 2001-313081 | 11/2001 |
| JP | 2002-238174 | 8/2002 |
| JP | 2005-051964 | 2/2005 |
| JP | 2005-110210 | 4/2005 |
| JP | 2006-244905 | 9/2006 |

* cited by examiner

*Primary Examiner* — Patrick Assouad
*Assistant Examiner* — Steve T Chung
(74) *Attorney, Agent, or Firm* — Nixon & Vanderhye P.C.

(57) ABSTRACT

When a battery pack, comprising an overcurrent protection section for stopping, when a current greater than a first threshold value passes, a current supply, is connected to a power supply terminal of an information processing apparatus, the information processing apparatus draws a current greater than the first threshold value. Thereafter, an output current and output voltage of the battery pack are detected, thereby measuring a time period from when a current drawing section draws the current greater than the first threshold value to when the battery pack stops the current supply. When the measured time period is within a first predetermined time range, the battery pack is permitted to supply an electric power. On the other hand, when the measured time period is not in the first predetermined time range, the battery pack is prohibited from supplying the electric power.

15 Claims, 15 Drawing Sheets

US 8,143,858 B2

ELECTRICAL APPARATUS, ELECTRICAL APPARATUS SYSTEM, AND POWER SUPPLY APPARATUS

CROSS REFERENCE TO RELATED APPLICATION

The disclosure of Japanese Patent Applications No. 2006-020467, filed Jan. 30, 2006, and No. 2006-318854, filed Nov. 27, 2006, is incorporated herein by reference.

BACKGROUND OF THE INVENTION

1. Field of the Invention

The present invention relates to a determination of whether a power supply apparatus such as a battery pack and an AC adapter has a satisfactory level of safety. More particularly, the present invention relates to an electrical apparatus capable of determining whether a power supply apparatus satisfies a predetermined safety specification.

2. Description of the Background Art

A consumable product, such as a battery pack (hereinafter, referred to as a "BP") of a lithium ion battery, which is attached to an electrical apparatus, needs to satisfy a predetermined specification in order to assure a safety. When a BP which does not satisfy the predetermined specification (e.g., a non-licensed product) is used, a fluid leakage or heat generation of the BP may occur. Note that a licensed product is defined as a product which is developed and manufactured by a manufacturer of the electrical apparatus for which the BP is used, or a manufacturer licensed by the manufacturer, and which has the safety confirmed by the manufacturers. Any product which does not satisfy a definition mentioned above is defined as a non-licensed product. Therefore, it is extremely impotent to check whether or not a BP attached to an electrical apparatus satisfies a specification regarding the safety (hereinafter, referred to as a "safety specification"). As a method of checking whether the BP satisfies the safety specification, the following methods are used. Note that the safety specification defined in the present invention includes various specifications such as an official specification, a specification provided by a company, and a product specification adopted for each product. (In general, the product specification adopted for each product is not a standardized specification.)

Firstly, a method, of mounting a BP to a main body of an electrical apparatus only when a shape of a BP container of the electrical apparatus structurally coincides with a shape of the BP, is used. There is also a method of previously writing a predetermined ID code into an EEPROM of a BP. In this method, an electrical apparatus reads the ID code, and if the read ID code has desired contents, it is determined that the BP satisfies the safety specification.

Furthermore, a method, of mounting an exclusive encryption IC to an electrical apparatus and a BP, is also used. In this method, the exclusive IC has a security code written therein, and whether the BP satisfies the safety specification is detected by using a method such as a CHAP (Challenge Handshake Authentication Protocol) between the electrical apparatus and the BP.

Still furthermore, a method, of mounting a resistance or a thermistor to a BP, is also used. In this case, a predetermined voltage is applied from an electrical apparatus to the BP, and a resistance value of the BP is read based on a voltage division ratio. Or a predetermined constant current is applied from the electrical apparatus to the BP, and reads a voltage of the BP, thereby reading a resistance value of the BP. If the read resistance value is different from a predetermined value previously set as a normal value, it is determined that the BP does not satisfy the safety specification.

Still furthermore, a method of mounting, instead of the resistance or the thermistor, an element having a special characteristic (a characteristic changed over time) to a BP is also used (Japanese Laid-Open Patent Publication No. 2005-110210, for example). In this method, an electric power is supplied to the element having the special characteristic, and detects an electrical characteristic of the element, thereby determining whether or not the BP satisfies the safety specification.

However, the aforementioned methods have the following problems. Firstly, in the method of causing the shape of the BP container of the electrical apparatus to structurally coincide with the shape of the BP, even if the BP does not satisfy the safety specification, the BP may be mistakenly mounted to the electrical apparatus if the BP has a shape imitating that of the BP container. Furthermore, similarly to the aforementioned method, in the method of previously writing the predetermined ID code in the EEPROM of the BP, even if the BP does not satisfy the safety specification, the BP may be mistakenly mounted to the electrical apparatus if an EEROM of the BP has contents copied from that of a BP satisfying the safety specification. Still furthermore, in the method of mounting the exclusive encryption IC to the electrical apparatus and the BP, the exclusive IC needs to be separately provided, thereby generating an extra cost. In the method of using the resistance or the thermistor, the BP may be mistakenly determined to satisfy the safety specification if the resistance or the thermistor is copied, and the BP includes such a copied component. Still furthermore, in the method disclosed in Japanese Laid-Open Patent Publication No. 2005-110210, the element having the special characteristic needs to be separately provided, thereby generating an extra cost.

SUMMARY OF THE INVENTION

Therefore, an object of the present invention is to provide an information processing apparatus capable of confirming whether or not a power supply apparatus has a satisfactory level of safety at a low cost, even when no special component is provided in the information processing apparatus.

The present invention has the following features to attain the object mentioned above. Note that reference numerals and supplementary remarks in parentheses below are for assisting the reader in finding corresponding components in the figures to facilitate the understanding of the present invention, but they are in no way intended to restrict the scope of the invention.

A first aspect is directed to an electrical apparatus which is connected to a power supply apparatus at least comprising an output stopping section (21, 22, 25) for detecting that a current greater than or equal to a first predetermined value passes for a first time period, and for stopping an output of the power supply apparatus, the electrical apparatus comprises: a circuit section (15); a first current drawing section (12); and a first detection section (11). The circuit section is operable to pass a current to the power supply apparatus. The first current drawing section draws, before the current starts to pass between the power supply apparatus and the circuit section, the current greater than or equal to the first predetermined value from the power supply apparatus. The first detection section detects that the output of the power supply apparatus is stopped when the first time period has passed from a time at which the first current drawing section starts to draw the current greater than or equal to the first predetermined value from the power supply apparatus. In such a structure, after the first detection section detects that the output of the power supply apparatus is stopped when the first time period has passed, the electrical apparatus starts to pass the current between the power supply apparatus and the circuit section so as to operate the circuit section. Note that the first detection section may detect a current value, or other values (e.g., a voltage value), which are used as conditions for passing the current greater than or equal to the first predetermined value. Although the first predetermined value is typically a current value obtained when an overcurrent protection operation is started, the first predetermined value is not limited thereto. Furthermore, although the first time period is typically an unresponsive time, the first time period is not limited thereto. Still furthermore, although the output stopping section is typically an overcurrent protection section, the output stopping section is not limited thereto. "Before the current starts to pass between the power supply apparatus and the circuit section" indicates when the power supply apparatus is connected to the electrical apparatus, when the power supply apparatus is connected to the electrical apparatus, and then a power supply switch of the electrical apparatus is operated, when an AC adapter as an example of the power supply apparatus is connected to the electrical apparatus, and then the electrical apparatus is connected to an electric outlet, and when a battery pack as an example of the power supply apparatus is connected to a recharger as an example of the electrical apparatus, and then the recharger is connected to the electric outlet, for example. Furthermore, the circuit section may be a processing section for performing a predetermined operation such as information processing by using an electric power supplied from the power supply apparatus, or may be a recharging circuit section for recharging the power supply apparatus by using the electric power supplied from the power supply apparatus. The electrical apparatus may be an information processing apparatus, a recharger, or the like. Furthermore, due to the design and manufacture precision of the power supply apparatus, the first time period may differ from one power supply apparatus to another power supply apparatus. In such a case, the first detection section preferably uses an allowable maximum time (i.e., an allowable upper limit time) of the first time period. However, a standard time of the first time period or an allowable minimum time (i.e., an allowable lower limit time) of the first time period may be used so as to determine a predetermined range of the first time period, thereby confirming that the output of the power supply apparatus is stopped within the predetermined range of the first time period.

In a second aspect based on the first aspect, the first predetermined value is a current value obtained when the power supply apparatus starts an overcurrent protection operation. The first time period is an unresponsive time set for the overcurrent protection operation performed by the power supply apparatus. The output stopping section is an overcurrent protection circuit.

In a third aspect based on the second aspect, the first detection section detects that the output of the power supply apparatus is stopped before at least an allowable maximum time of the first time period has passed, from the time at which the first current drawing section starts to draw the current greater than or equal to the first predetermined value from the power supply apparatus.

In a fourth aspect based on the third aspect, the first detection section detects that the output of the power supply apparatus is stopped in a time period from when an allowable minimum time of the first time period has passed to when the allowable maximum time of the first time period has passed, from the time at which the first current drawing section starts to draw the current greater than or equal to the first predetermined value from the power supply apparatus.

In a fifth aspect based on the first aspect, the power supply apparatus is a battery pack. The electrical apparatus is an information processing apparatus which is operated by using an electric power supplied from the battery pack. The first current drawing section and the first detection section are operable to pass a current to the battery pack, and are operated by using the electric power outputted from the battery pack.

In a sixth aspect based on the first aspect, the power supply apparatus is an AC adapter. The electrical apparatus is an information processing apparatus which is operated by using an electric power supplied from the AC adapter. The first current drawing section and the first detection section are operable to pass a current to the AC adapter, and are operated by using the electric power outputted from the AC adapter.

In a seventh aspect based on the first aspect, the power supply apparatus is an AC adapter. The electrical apparatus is a recharger for recharging a battery pack, or an information processing apparatus having a circuit for recharging the battery pack. The first current drawing section and the first detection section are operable to pass a current to the AC adapter, and recharge the battery pack by using an electric power outputted from the AC adapter, after the first detection section detects that the output of the power supply apparatus is stopped when the first time period has passed from the time at which the first current drawing section starts to draw the current greater than or equal to the first predetermined value from the power supply apparatus.

In an eighth aspect based on the first aspect, the power supply apparatus is a battery pack. The electrical apparatus is a recharger for recharging the battery pack, or an information processing apparatus having a circuit for recharging the battery pack. The first current drawing section and the first detection section are operable to pass a current to the battery pack.

In a ninth aspect based on the first aspect, the electrical apparatus further comprises a second current drawing section for drawing a current smaller than the first predetermined value for a predetermined time period. The first detection section further detects that the output of the power supply apparatus is not stopped within the predetermined time period.

In a tenth aspect based on the first aspect, the power supply apparatus further comprises a return section (23) for restarting the output of the power supply apparatus when a predetermined condition regarding a current or a voltage of the power supply apparatus is satisfied, after the output stopping section stops the output of the power supply apparatus. The electrical apparatus further comprises a return current drawing section (12) and a second detection section (11). The return current drawing section draws a return current from the power supply apparatus so as to satisfy the predetermined condition, after the output of the power supply apparatus is stopped. The second detection section detects that the output of the power supply apparatus is restarted after at least a second time period has passed from a time at which the return current drawing section starts to draw the return current from the power supply apparatus. Furthermore, after the first detection section detects that the output of the power supply apparatus is stopped before the first time period has passed, and the second detection section further detects that the output of the power supply apparatus is restarted after the second time period has passed, the electrical apparatus starts to pass the current between the power supply apparatus and the circuit section so as to operate the circuit section. Note that the second detection section detects that the output of the power supply apparatus is restarted after a return delay time has passed from a time at which the return current drawing section draws the return current from the power supply apparatus, for example. Or the second detection section may detect that the output of the power supply apparatus is restarted in a time period from when an allowable minimum time of the return delay time has passed to when an allowable maximum time of the return delay time has passed from the time at which the return current drawing section draws the return current from the power supply apparatus. Or the second detection section may detect that the output of the power supply apparatus is restarted when the return delay time or a time in the vicinity thereof has passed. Note that in there turn current drawing section, a current used for restarting the output of the power supply apparatus may be 0 mA (i.e., the return current drawing section may function as an open circuit). In this case, even if the electrical apparatus does not draw a current from the battery pack, the battery pack can return from the overcurrent protection state. Or due to a leakage current flowing in the battery pack, a voltage of the battery pack in the overcurrent protection state may be different from that of the battery pack in a normal state. Thus, by detecting a difference between the voltage of the battery pack in the overcurrent protection state and the voltage of the battery pack in the normal state, it becomes possible to detect that the battery pack returns to the normal state from the overcurrent protection state.

In an eleventh aspect based on the first aspect, the power supply apparatus further comprises a return section for restarting the output of the power supply apparatus when a predetermined condition regarding a current or a voltage of the power supply apparatus is satisfied, after the output stopping section stops the output of the power supply apparatus. The electrical apparatus further comprises a return current drawing section for drawing a return current from the power supply apparatus so as to satisfy the predetermined condition, after the output of the power supply apparatus is stopped; and a second detection section for detecting that the output of the power supply apparatus is restarted when a second time period has passed from a time at which the return current drawing section starts to draw the return current from the power supply apparatus. Furthermore, after the first detection section detects that the output of the power supply apparatus is stopped when the first time period has passed, and the second detection section further detects that the output of the power supply apparatus is restarted when the second time period has passed, the electrical apparatus starts to pass the current between the power supply apparatus and the circuit section so as to operate the circuit section.

In a twelfth aspect based on the first aspect, the power supply apparatus further comprises a memory section (31); a first communication terminal (6); and a change section (26). The memory section stores a parameter regarding the first time period. The first communication terminal performs a communication with the electrical apparatus. The change section changes the parameter stored in the memory section in accordance with a predetermined control signal transmitted from the electrical apparatus through the first communication terminal. The electrical apparatus further comprises a second communication terminal (7) and a change instruction section (11). The second communication terminal performs a communication with the power supply apparatus when the electrical apparatus is connected to the power supply apparatus. The change instruction section transmits the predetermined control signal to the power supply apparatus through the second communication terminal, before the first current drawing section starts to pass the current between the power supply apparatus and the circuit section.

A thirteenth aspect is directed to an electrical apparatus which is connected to a power supply apparatus at least comprising an output stopping section (21, 22, 25) for detecting that a current greater than or equal to a first predetermined value passes for a first time period, and for stopping an output of the power supply apparatus, the electrical apparatus comprises: a circuit section (15); a first current drawing section (12); and a first detection section (11). The circuit section is operable to pass a current to the power supply apparatus. The first current drawing section draws, before the current starts to pass between the power supply apparatus and the circuit section, the current greater than or equal to the first predetermined value from the power supply apparatus. The first detection section detects that the output of the power supply apparatus is stopped before the first time period has passed from a time at which the first current drawing section starts to draw the current greater than or equal to the first predetermined value from the power supply apparatus. In such a structure, after the first detection section detects that the output of the power supply apparatus is stopped before the first time period has passed, the electrical apparatus starts to pass the current between the power supply apparatus and the circuit section so as to operate the circuit section. Note that the first current drawing section may draw a current greater than or equal to the first predetermined value from the power supply apparatus immediately before the current starts to pass between the power supply apparatus and the circuit section.

In a fourteenth aspect based on the thirteenth aspect, the first predetermined value is a current value obtained when the power supply apparatus starts an overcurrent protection operation. The first time period is an unresponsive time set for the overcurrent protection operation performed by the power supply apparatus. The output stopping section is an overcurrent protection circuit.

In a fifteenth aspect based on the fourteenth aspect, the first detection section detects that the output of the power supply apparatus is stopped before at least an allowable maximum time of the first time period has passed, from the time at which the first current drawing section starts to draw the current greater than or equal to the first predetermined value from the power supply apparatus.

In a sixteenth aspect based on the fifteenth aspect, the first detection section detects that the output of the power supply apparatus is stopped in a time period from when an allowable minimum time of the first time period has passed to when the allowable maximum time of the first time period has passed, from the time at which the first current drawing section starts to draw the current greater than or equal to the first predetermined value from the power supply apparatus.

In a seventeenth aspect based on the thirteenth aspect, the power supply apparatus is a battery pack. The electrical apparatus is an information processing apparatus which is operated by using an electric power supplied from the battery pack. The first current drawing section and the first detection section are operable to pass a current to the battery pack, and are operated by using the electric power outputted from the battery pack.

In an eighteenth aspect based on the thirteenth aspect, the power supply apparatus is an AC adapter. The electrical apparatus is an information processing apparatus which is operated by using an electric power supplied from the AC adapter. The first current drawing section and the first detection section are operable to pass a current to the AC adapter, and are operated by using the electric power outputted from the AC adapter.

In a nineteenth aspect based on the thirteenth aspect, the power supply apparatus is an AC adapter. The electrical apparatus is a recharger for recharging a battery pack, or an information processing apparatus having a circuit for recharging the battery pack. The first current drawing section and the first detection section are operable to pass a current to the AC adapter, and recharge the battery pack by using an electric power outputted from the AC adapter, after the first detection section detects that the output of the power supply apparatus is stopped when the first time period has passed from the time at which the first current drawing section starts to draw the current greater than or equal to the first predetermined value from the power supply apparatus.

In a twentieth aspect based on the thirteenth aspect, the power supply apparatus is a battery pack. The electrical apparatus is a recharger for recharging the battery pack, or an information processing apparatus having a circuit for recharging the battery pack. The first current drawing section and the first detection section are operable to pass a current to the battery pack.

In a twenty-first aspect based on the thirteenth aspect, the electrical apparatus further comprises a second current drawing section for drawing a current smaller than the first predetermined value for a predetermined time period. Furthermore, the first detection section further detects that the output of the power supply apparatus is not stopped within the predetermined time period.

In a twenty-second aspect based on the thirteenth aspect, the power supply apparatus further comprises a return section (23) for restarting the output of the power supply apparatus when a predetermined condition regarding a current or a voltage of the power supply apparatus is satisfied, after the output stopping section stops the output of the power supply apparatus. The electrical apparatus further comprises a return current drawing section (12) and a second detection section (11). The return current drawing section draws a return current from the power supply apparatus so as to satisfy the predetermined condition, after the output of the power supply apparatus is stopped. The second detection section detects that the output of the power supply apparatus is restarted after at least a second time period has passed from a time at which the return current drawing section starts to draw the return current from the power supply apparatus. Furthermore, after the first detection section detects that the output of the power supply apparatus is stopped before the first time period has passed, and the second detection section further detects that the output of the power supply apparatus is restarted after the second time period has passed, the electrical apparatus starts to pass the current between the power supply apparatus and the circuit section so as to operate the circuit section. Note that the second detection section detects that the output of the power supply apparatus is restarted after a return delay time has passed from a time at which the return current drawing section draws the return current from the power supply apparatus, for example. Or the second detection section may detect that the output of the power supply apparatus is restarted in a time period from when an allowable minimum time of the return delay time has passed to when an allowable maximum time of the return delay time has passed from the time at which the return current drawing section draws the return current from the power supply apparatus. Or the second detection section may detect that the output of the power supply apparatus is restarted when the return delay time or a time in the vicinity thereof has passed. Note that in the return current drawing section, a current used for restarting the output of the power supply apparatus may be 0 mA (i.e., the return current drawing section may function as an open circuit). In this case, even if the electrical apparatus does not draw a current from the battery pack, the battery pack can return from the overcurrent protection state. Or due to a leakage current flowing in the battery pack, a voltage of the battery pack in the overcurrent protection state may be different from that of the battery pack in a normal state. Thus, by detecting a difference of the voltage therebetween, it becomes possible to detect that the battery pack returns to the normal state from the overcurrent protection state.

In a twenty-third aspect based on the thirteenth aspect, the power supply apparatus further comprises a return section for restarting the output of the power supply apparatus when a predetermined condition regarding a current or a voltage of the power supply apparatus is satisfied, after the output stopping section stops the output of the power supply apparatus. The electrical apparatus further comprises a return current drawing section for drawing a return current from the power supply apparatus so as to satisfy the predetermined condition, after the output of the power supply apparatus is stopped, and a second detection section for detecting that the output of the power supply apparatus is restarted when a second time period has passed from a time at which the return current drawing section starts to draw the return current from the power supply apparatus. Furthermore, after the first detection section detects that the output of the power supply apparatus is stopped when the first time period has passed, and the second detection section further detects that the output of the power supply apparatus is restarted when the second time period has passed, the electrical apparatus starts to pass the current between the power supply apparatus and the circuit section, and operates the circuit section.

In a twenty-fourth aspect based on the thirteenth aspect, the power supply apparatus further comprises a memory section (31); a first communication terminal (6); and a change section (26). The memory section stores a parameter regarding the first time period. The first communication terminal performs a communication with the electrical apparatus. The change section changes the parameter stored in the memory section in accordance with a predetermined control signal transmitted from the electrical apparatus through the first communication terminal. Furthermore, the electrical apparatus further comprises a second communication terminal (7) and a change instruction section (11). The second communication terminal performs a communication with the power supply apparatus when the electrical apparatus is connected to the power supply apparatus. The change instruction section transmits the predetermined control signal to the power supply apparatus through the second communication terminal, before the first current drawing section starts to pass the current between the power supply apparatus and the circuit section.

A twenty-fifth aspect is directed to an electrical apparatus system controlled by a power supply apparatus and an electrical apparatus connected to the power supply apparatus. The power supply apparatus at least comprises an output stopping section for detecting that a current greater than or equal to a first predetermined value passes for a first time period, and for stopping an output of the power supply apparatus. The electrical apparatus comprises: a circuit section; a first current drawing section; and a first detection section. The circuit section is operable to pass a current to the power supply apparatus. The first current drawing section draws, before the current starts to pass between the power supply apparatus and the circuit section, the current greater than or equal to the first predetermined value from the power supply apparatus. The first detection section detects that the output of the power supply apparatus is stopped when the first time period has passed from a time at which the first current drawing section starts to draw the current greater than or equal to the first predetermined value from the power supply apparatus. After the first detection section detects that the output of the power supply apparatus is stopped when the first time period has passed, the electrical apparatus starts to pass the current between the power supply apparatus and the circuit section so as to operate the circuit section. Furthermore, the electrical apparatus further comprises a control signal transmitting section for transmitting a predetermined control signal to the power supply apparatus, when the first detection section detects that the output of the power supply apparatus is stopped when the first time period has passed, and the output stopping section is operable to switch an operation mode between a first mode, in which the output stopping section detects that the current greater than or equal to the first predetermined value passes for the first time period and stops the output of the power supply apparatus, and a second mode, in which the output stopping section detects that a current greater than or equal to a second predetermined value passes for a second time period and stops the output of the power supply apparatus. Still furthermore, the power supply apparatus causes the output stopping section to be in the first mode before receiving the control signal, and causes the output stopping section to be in the second mode after receiving the control signal.

In a twenty-sixth aspect based on the twenty-fifth aspect, the power supply apparatus further comprises a connection state detection section (26, 27) for detecting a state in which the power supply apparatus is connected to the electrical apparatus. When the connection state detection section detects that the power supply apparatus is not connected to the electrical apparatus, the power supply apparatus causes the output stopping section to be in the first mode.

In a twenty-seventh aspect based on the twenty-fifth aspect, the power supply apparatus further comprises a reduction section (29, 34) for reducing a current. Before receiving the control signal, the power supply apparatus causes the output stopping section to be in the first mode and activates the reduction section, and after receiving the control signal, the power supply apparatus causes the output stopping section to be in the second mode and inactivates the reduction section.

A twenty-eighth aspect is directed to an electrical apparatus system controlled by a power supply apparatus and an electrical apparatus connected to the power supply apparatus. The power supply apparatus at least comprises an output stopping section for detecting that a current greater than or equal to a first predetermined value passes for a first time period, and for stopping an output of the power supply apparatus. The electrical apparatus comprises: a circuit section; a first current drawing section; and a first detection section. The circuit section is operable to pass a current to the power supply apparatus. The first current drawing section draws, before the current starts to pass between the power supply apparatus and the circuit section, the current greater than or equal to the first predetermined value from the power supply apparatus. The first detection section detects that the output of the power supply apparatus is stopped before the first time period has passed from a time at which the first current drawing section starts to draw the current greater than or equal to the first predetermined value from the power supply apparatus. After the first detection section detects that the output of the power supply apparatus is stopped before the first time period has passed, the electrical apparatus starts to pass the current between the power supply apparatus and the circuit section so as to operate the circuit section. Furthermore, the electrical apparatus further comprises a control signal transmitting section for transmitting a predetermined control signal to the power supply apparatus, when the first detection section detects that the output of the power supply apparatus is stopped before the first time period has passed, and the output stopping section is operable to switch an operation mode between a first mode, in which the output stopping section detects that the current greater than or equal to the first predetermined value passes for the first time period and stops the output of the power supply apparatus, and a second mode, in which the output stopping section detects that a current greater than or equal to a second predetermined value passes for a second time period and stops the output of the power supply apparatus. Still furthermore, the power supply apparatus causes the output stopping section to be in the first mode before receiving the control signal, and causes the output stopping section to be in the second mode after receiving the control signal.

In a twenty-ninth aspect based on the twenty-eighth aspect, the power supply apparatus further comprises a connection state detection section (26, 27) for detecting a state in which the power supply apparatus is connected to the electrical apparatus. When the connection state detection section detects that the power supply apparatus is not connected to the electrical apparatus, the power supply apparatus causes the output stopping section to be in the first mode.

In a thirtieth aspect based on the twenty-eighth aspect, the power supply apparatus further comprises a reduction section (29, 34) for reducing a current. Before receiving the control signal, the power supply apparatus causes the output stopping section to be in the first mode and activates the reduction section, and after receiving the control signal, the power supply apparatus causes the output stopping section to be in the second mode and inactivates the reduction section.

A thirty-first aspect is directed to a power supply apparatus, connected to an electrical apparatus, which supplies an electric power to the electrical apparatus, the power supply apparatus comprising: an output stopping section; a connection state detection section; and a control section. The output stopping section is operable to switch an operation mode between a first mode, in which the output stopping section detects that a current greater than or equal to a first predetermined value passes for a first time period and stops an output of the power supply apparatus, and a second mode, in which the output stopping section detects that a current greater than or equal to a second predetermined value, which is greater than the first predetermined value, passes for a second time period and stops the output of the power supply apparatus. The connection state detection section detects a state in which the power supply apparatus is connected to the electrical apparatus. The control section for causing the output stopping section to be in the first mode, when the connection state detection section detects that the power supply apparatus is not connected to the electrical apparatus.

A thirty-second aspect is directed to an electrical apparatus system including an electrical apparatus and a power supply apparatus which supplies an electric power to the electrical apparatus. The power supply apparatus (70) comprises: a power supply section (3); an output terminal (4); a protection circuit (2); and a first terminal (71). The output terminal outputs an electric power supplied from the power supply section to an exterior of the power supply apparatus. The protection circuit stops the electric power outputted from the power supply section to the output terminal. The first terminal applies an electrical input so as to instruct the protection circuit to stop the electric power outputted from the power supply section to the output terminal. Note that the electrical input indicates a current, a voltage or a control signal. The electrical apparatus (80) comprises: an input terminal (5); a second terminal (81); a circuit section (15); and a supply control section (11). The input terminal is connected to the output terminal. The second terminal is connected to the first terminal. The circuit section is operated by using an electric power inputted to the input terminal. The supply control section controls the electric power inputted to the input terminal to be supplied to the circuit section. Furthermore, the supply control section includes: a stop control section (11, 82); a detection section (11); and a supply start section (11, 14). The stop control section outputs an electrical input to the second terminal so as to instruct the protection circuit to stop the electric power outputted from the power supply section to the output terminal, before the electric power inputted to the input terminal starts to be supplied to the circuit section. The detection section detects that the electric power inputted to the input terminal is stopped, after the stop control section outputs the electrical input to the second terminal so as to instruct the protection circuit to stop the electric power outputted from the power supply section to the output terminal. The supply start section starts to supply the electric power inputted to the input terminal to the circuit section, if the detection section detects that the electric power inputted to the input terminal is stopped.

In a thirty-third aspect based on the thirty-second aspect, the protection circuit includes a sensor section for detecting an electrical state of an interior of the power supply apparatus. When the sensor section detects that the electrical state is a predetermined state, the protection circuit stops the electric power outputted to the output terminal. When the sensor section detects that the electrical state is not the predetermined state, the protection circuit restarts the electric power outputted to the output terminal. Note that the electrical state indicates an electrical state of the output terminal. More specifically, the electrical state indicates a state of a current flowing in the output terminal.

In a thirty-fourth aspect based on the thirty-third aspect, the protection circuit is an overcurrent protection circuit.

In a thirty-fifth aspect based on the thirty-fourth aspect, the sensor section detects whether a voltage at a predetermined point of the interior of the power supply apparatus indicates an overcurrent state. The stop control section outputs the voltage indicating the overcurrent state to the second terminal. The first terminal inputs, to the detection section, the voltage, at the predetermined point, which indicates the overcurrent state.

In a thirty-sixth aspect based on the thirty-fifth aspect, the stop control section outputs the voltage inputted to the input terminal to the second terminal. Note that the stop control section may input the voltage inputted to the input terminal to the second terminal, or input a voltage, lower than (or higher than) the voltage inputted to the input terminal, to the second terminal. When the voltage inputted to the input terminal is inputted to the second terminal, it is preferable that a circuit for lowering a voltage between the first terminal and the protection circuit (e.g., a resistance 72 in a third embodiment) is provided in the power supply apparatus.

In a thirty-seventh aspect based on the nineteenth aspect, the protection circuit includes a sensor section for detecting an electrical state of an interior of the power supply apparatus. When the sensor section detects that the electrical state is a predetermined state, the protection circuit stops the electric power outputted to the output terminal. The stop control section outputs an electrical input indicating the predetermined state to the second terminal. The second terminal inputs the received electrical input indicating the predetermined state to the detection section.

In a thirty-eighth aspect based on the nineteenth aspect, the supply control section is operated by using the electric power inputted to the input terminal.

In a thirty-ninth aspect based on the thirty-eighth aspect, the electrical apparatus further comprises an electric power accumulation section for accumulating the electric power inputted to the input terminal. The supply control section is connected to the electric power accumulation section, and when the electric power inputted to the input terminal is stopped after the stop control section outputs the electrical input to the second terminal so as to instruct the protection circuit to stop the electric power outputted from the power supply section to the output terminal, the electrical apparatus is operated by using an electric power accumulated in the electric power accumulation section.

In a fortieth aspect based on the thirty-second aspect, the protection circuit detects an overcurrent state, and stops the electric power outputted from the power supply section to the output terminal when the detected overcurrent state continues for a predetermined time period. The stop control section outputs an electrical input indicating the overcurrent state to the second terminal. The detection section detects, when the predetermined time period has passed from a time at which the stop control section outputs the electrical input to the second terminal or before the predetermined time period has passed from the time at which the stop control section outputs the electrical input to the second terminal, that the electric power inputted to the input terminal is stopped.

A forty-first aspect is directed to an electrical apparatus of an electrical apparatus system including the electrical apparatus and a power supply apparatus which supplies an electric power to the electrical apparatus. The power supply apparatus comprises: a power supply section (3); an output terminal (4) for outputting an electric power supplied from the power supply section to an exterior of the power supply apparatus; a protection circuit (2) for stopping the electric power outputted from the power supply section to the output terminal; and a first terminal (71) for applying an electrical input so as to instruct the protection circuit to stop the electric power outputted from the power supply section to the output terminal. The electrical apparatus comprises: an input terminal (5) connected to the output terminal; a second terminal (81) connected to the first terminal; a circuit section (15) to be operated by using an electric power inputted to the input terminal; and a supply control section (11) for controlling the electric power inputted to the input terminal to be supplied to the circuit section. Furthermore, the supply control section includes: a stop control section (11, 82); a detection section (11); and a supply start section (11, 14). The stop control section outputs an electrical input to the second terminal so as to instruct the protection circuit to stop the electric power outputted from the power supply section to the output terminal, before the electric power inputted to the input terminal starts to be supplied to the circuit section. The detection section detects that the electric power inputted to the input terminal is stopped, after the stop control section outputs the electrical input to the second terminal so as to instruct the protection circuit to stop the electric power outputted from the power supply section to the output terminal. The supply start section (11, 14) starts to supply the electric power inputted to the input terminal to the circuit section, if the detection section detects that the electric power inputted to the input terminal is stopped.

A forty-second aspect is directed to a power supply apparatus of an electrical apparatus system including an electrical apparatus and the power supply apparatus which supplies an electric power to the electrical apparatus. The power supply apparatus comprises: a power supply section (3); an output terminal (4) for outputting an electric power supplied from the power supply section to an exterior of the power supply apparatus; a protection circuit (2) for stopping the electric power outputted from the power supply section to the output terminal; and a first terminal (71) for applying an electrical input so as to instruct the protection circuit to stop the electric power outputted from the power supply section to the output terminal. The electrical apparatus comprises: an input terminal (5); a second terminal (81); a circuit section (15); and a circuit section (15). The input terminal is connected to the output terminal. The second terminal is connected to the first terminal. The circuit section is operated by using an electric power inputted to the input terminal. The supply control section controls the electric power inputted to the input terminal to be supplied to the circuit section. Furthermore, the supply control section includes: a stop control section (11, 82); a detection section (11); and a supply start section (11, 14). The stop control section outputs an electrical input to the second terminal so as to instruct the protection circuit to stop the electric power outputted from the power supply section to the output terminal, before the electric power inputted to the input terminal starts to be supplied to the circuit section. The detection section detects that the electric power inputted to the input terminal is stopped, after the stop control section outputs the electrical input to the second terminal so as to instruct the protection circuit to stop the electric power outputted from the power supply section to the output terminal. The supply start section (11, 14) starts to supply the electric power inputted to the input terminal to the circuit section, if the detection section detects that the electric power inputted to the input terminal is stopped.

According to the first aspect, a power supply apparatus which does not stop an electric power supply before a predetermined time has passed can be determined. Thus, it becomes possible to prevent an accident to be occurred in the power supply apparatus. Furthermore, because a special function does not need to be provided in the power supply apparatus, a cost required for manufacturing the power supply apparatus can be reduced.

According to the second to ninth aspects, a power supply apparatus which does not satisfy a safety specification can be determined by using an overcurrent protection function. Thus, even if the power supply apparatus which does not satisfy a predetermined safety specification is attached to an electrical apparatus, it is possible to cause the electrical apparatus not to be operated, thereby making it possible to prevent the accident to be occurred in the power supply apparatus which does not satisfy the predetermined safety specification.

According to the tenth to eleventh aspects, by measuring a time period required until the power supply apparatus once stops the electric power supply, and then returns to a normal state, whether the power supply apparatus satisfies the predetermined specification is determined. Therefore, it becomes possible to more strictly check whether or not the power supply apparatus satisfies the predetermined safety specification.

According to the twelfth aspect, the parameter used for checking whether the power supply apparatus satisfies the predetermined safety specification can be changed. Therefore, it becomes possible to more strictly check whether or not the power supply apparatus satisfies the predetermined safety specification.

According to the thirteenth aspect, an effect similar to that of the first aspect can be obtained.

According to the fourteenth to twenty-first aspects, an effect similar to that of the second to ninth aspects can be obtained.

According to the twenty-second to twenty-third aspects, an effect similar to that of the tenth to eleventh aspects can be obtained.

According to the twenty-fourth aspect, an effect similar to that of the twelfth aspect can be obtained.

According to the twenty-fifth aspect, the overcurrent protection operation can be started by using a weak current. Therefore, it becomes possible to more safely check whether or not the power supply apparatus satisfies the predetermined safety specification.

According to the twenty-sixth to twenty-seventh aspects, it is possible to cause the power supply apparatus to supply only a weak current when the power supply apparatus is not attached to the electrical apparatus. Therefore, a heat generation, occurred when using the power supply apparatus alone, can be reduced.

According to the twenty-eighth to thirtieth aspects, an effect similar to that of the twenty-fifth to twenty-seventh aspects can be obtained.

According to the thirty-first aspect, it is possible to cause the power supply apparatus to supply only a weak current when the power supply apparatus is not attached to the electrical apparatus. Therefore, a heat generation, occurred when using the power supply apparatus alone, can be reduced.

According to the thirty-second to thirty-third aspects, an effect similar to that of the first aspect can be obtained.

According to the thirty-fourth to fortieth aspects, the power supply apparatus which does not satisfy the safety specification can be determined by using the overcurrent protection function. Thus, even if the power supply apparatus which does not satisfy the predetermined safety specification is attached to an electrical apparatus, it is possible to cause the electrical apparatus not to be operated, thereby making it possible to prevent the accident to be occurred in the power supply apparatus which does not satisfy the predetermined safety specification. Furthermore, in order to determine the power supply apparatus which does not satisfy the predetermined safety specification, an exclusive terminal is used. Therefore, without performing an operation of drawing an overcurrent, for example, it becomes possible more safely to determine the power supply apparatus which does not satisfy the predetermined safety specification.

According to the forty-first and forty-second aspects, an effect similar to that of the first aspect can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings. Note that the present invention is not limited to the embodiments described below.

First Embodiment

Figure 1:
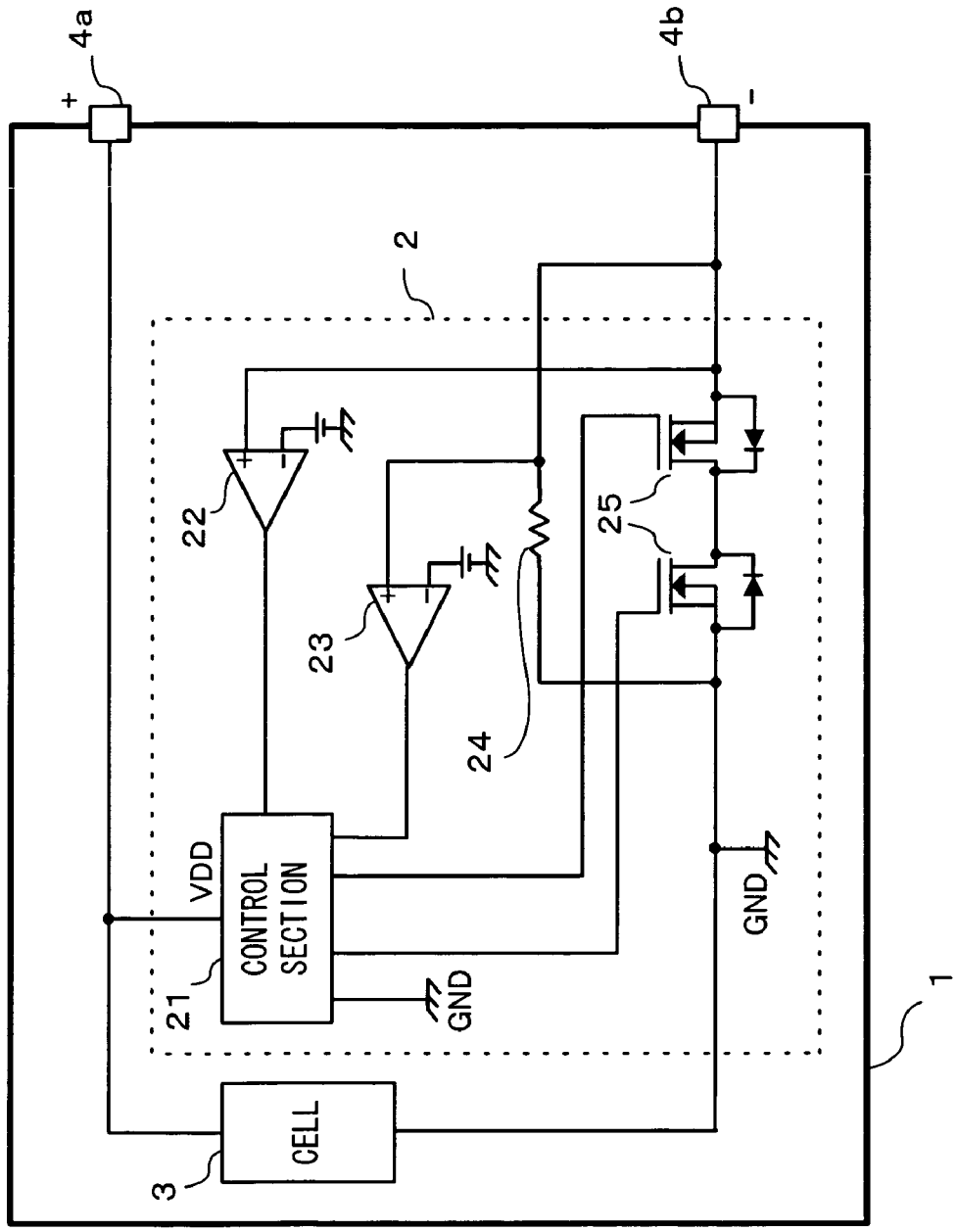
FIG. 1 is a diagram illustrating a structure of a battery pack 1 according to a first embodiment of the present invention.

FIG. 1 is a diagram illustrating a structure of a battery pack 1 (hereinafter, referred to as a "BP") according to a first embodiment of the present invention. In FIG. 1, the BP 1 comprises an overcurrent protection circuit 2, a cell 3, and positive and negative power supply terminals 4a and 4b.

The overcurrent protection circuit 2, operable to stop a large current discharge such as an external short-circuit, includes a control section 21, an overcurrent-detection voltage comparator 22, a return-condition-detection voltage comparator 23, a resistance 24, and a MOS element 25. The control section 21 is operable to control an entire operation of the overcurrent protection circuit 2 (e.g., the control section 21 waits until a predetermined time has passed when an overcurrent is detected, and then switches a state of the BP 1 from a normal state to an overcurrent protection state). An unresponsive time and a return delay time (both will be described later) are set in the control section 21. The control section 21 includes a timer for counting the unresponsive time and the return delay time. Note that the unresponsive time indicates a delay time from when the overcurrent protection circuit detects an overcurrent to when the overcurrent protection circuit actually starts an overcurrent protection operation, and the return delay time indicates a delay time from when the BP 1 becomes a state where the BP 1 can return from an overcurrent protection state (i.e., an unloaded state or a low load state) to when the BP 1 returns to the normal state from the overcurrent protection state. Due to a manufacturing error, each of the unresponsive time and the return delay time differs from product to product. Thus, both a minimum time and a maximum time are set so as to determine an allowable range of each of the unresponsive time and the return delay time, and if a product has each of the unresponsive time and the return delay time within a range between the minimum and maximum times of the unresponsive time and within a range between the minimum and maximum times of the return delay time, respectively, the product is offered in the market as a conforming product.

The overcurrent-detection voltage comparator 22 (hereinafter, referred to as an "overcurrent detector") is operable to detect an overcurrent. In the overcurrent detector 22, a voltage inputted to a positive terminal is compared with a reference voltage inputted to a negative terminal. If the voltage inputted to the positive terminal is higher than the reference voltage inputted to the negative terminal, it is determined that an overcurrent is detected. When it is determined that the overcurrent is detected, a status of a signal indicating a comparison result is reversed, and the signal indicating the comparison result is inputted to the control section 21 from the overcurrent detector 22. Note that in the present embodiment, the reference voltage of the overcurrent detector 22 is 0.18V.

The return-condition-detection voltage comparator 23 (hereinafter, referred to as a "return detector") is operable to detect whether a return condition of returning the BP 1 from the overcurrent protection state to the normal state is satisfied. Specifically, if a voltage inputted to a positive terminal is higher than a reference voltage of the return detector 23, it is determined that the return condition is satisfied. When it is determined that the return condition is satisfied, a status of a signal indicating a comparison result is reversed, and the signal indicating the comparison result is inputted to the control section 21 from the overcurrent detector 23. Note that in the present embodiment, the reference voltage of the return detector 23 is 3.5V.

In the present embodiment, a resistance value of the resistance 24 is $100K\Omega$.

The MOS element 25, located in a current path at a side of the negative power supply terminal 4b of the BP 1, is usually set to be turned on (i.e., the MOS element 25 is usually in a state where a voltage is applied to a gate electrode). However, when the overcurrent is detected, the MOS element 25 is set to be turned off (i.e., the MOS element 25 is to be in a state where the voltage is not applied to the gate electrode).

In the present embodiment, a voltage of the cell 3 is 4V.

Figure 2:
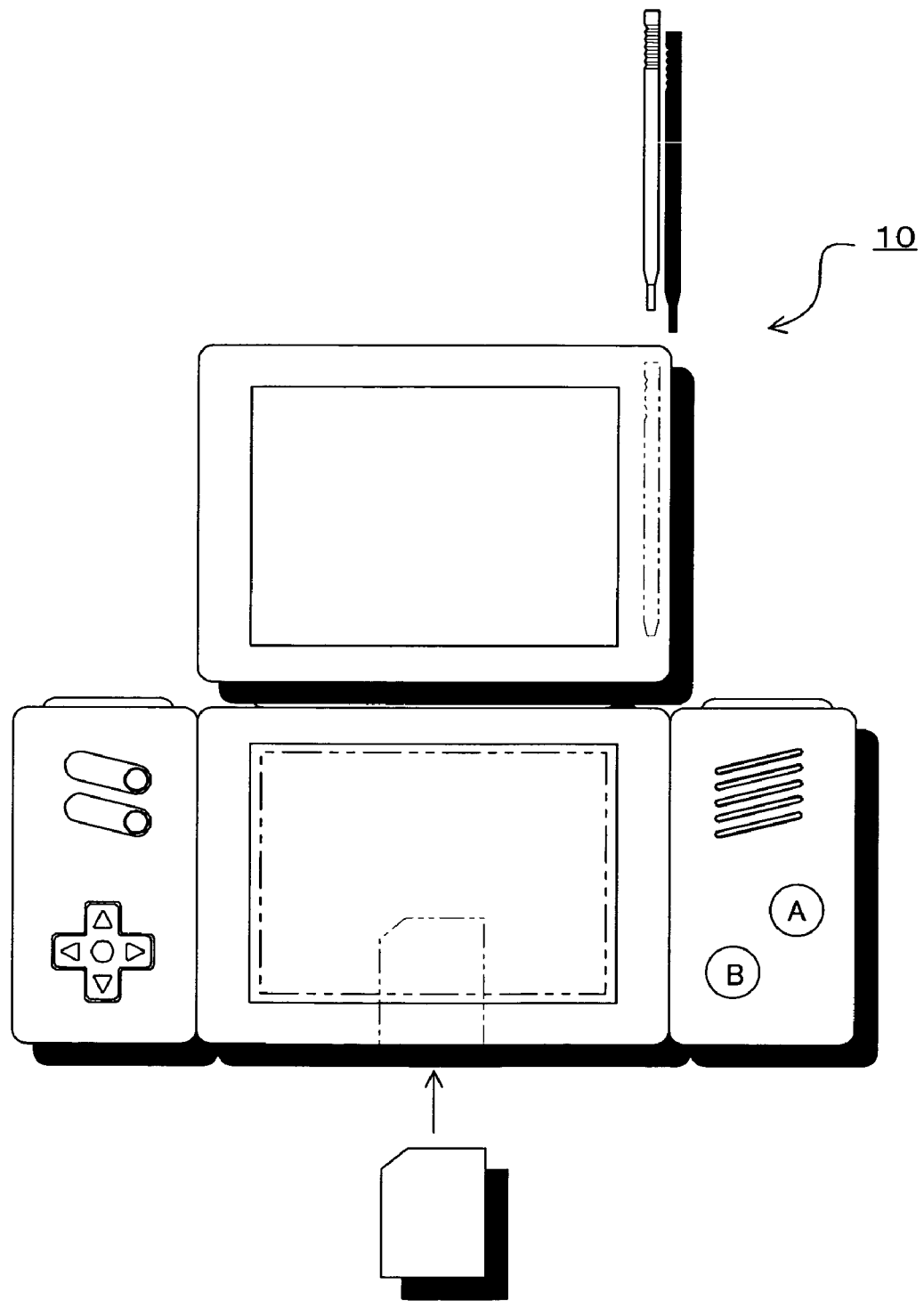
FIG. 2 is an external view illustrating a hand-held game apparatus 10.
Figure 3:
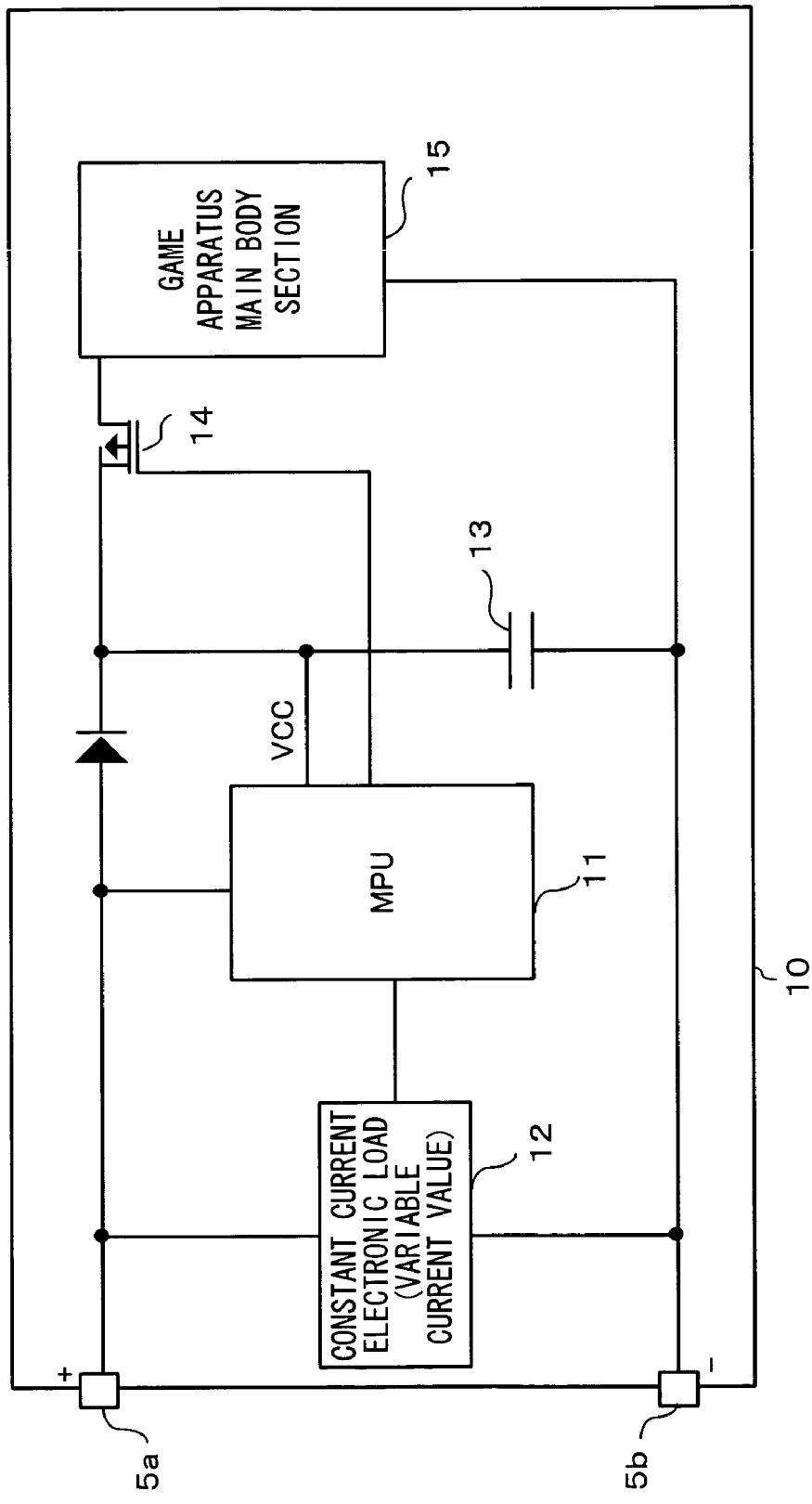
FIG. 3 is a view illustrating a structure of the hand-held game apparatus 10.

FIG. 2 is an external view illustrating a hand-held game apparatus 10 (hereinafter, referred to as a "game apparatus"). FIG. 3 is a view illustrating a structure of the game apparatus 10. The game apparatus 10 comprises a MPU 11 for controlling a process of checking a specification of the BP 1 (hereinafter, referred to as a "BP specification checking process"), a constant current electronic load 12, a capacitor 13, positive and negative power supply terminals 5a and 5b, a MOS-FET 14, and a game apparatus main body section 15. The MPU 11 is operable to control the BP specification checking process, which will be described later. The constant current electronic load 12 is a constant current electronic load (in the constant current electronic load 12, a minimum potential difference between the positive power supply terminal 5a and the negative power supply terminal 5b is extremely small. A value corresponding to the minimum potential difference therebetween is a finite value. However, in order to simplify the description hereinafter, it is assumed that the value is 0V). The constant current electronic load 12 draws, from the BP 1, a current of a value set by the MPU 11 for a time period set by the MPU 11. Although the present embodiment illustrates an example where the MPU 11 is a MPU, the MPU 11 may be a logic circuit or an analog circuit, which functions in a similar manner to the MPU. The MOS-FET 14 is operable to limit a current passing from the BP 1 to the game apparatus main body section 15. The MOS-FET 14 is turned off before performing the BP specification checking process, which will be described later. The game apparatus main body section 15 is a circuit included in a main body of the game apparatus.

Next, the BP specification checking process performed in the present embodiment will be briefly described. As described above, in the present embodiment, the BP 1 has a predetermined value, which is previously set therein, as each of an overcurrent detection value, the unresponsive time and the return delay time. The predetermined value is stored in the control section 21. The overcurrent detection value is a current threshold value for causing the BP 1 to switch to the overcurrent protection state (hereinafter, referred to as a "protection state"). Also, the overcurrent detection value is a value corresponding to the reference voltage of the overcurrent detector 22. In the present embodiment, it is assumed that the overcurrent detection value is 0.9 A. Ideally speaking, it is desirable that the unresponsive time is an equal and uniform value between products. However, realistically speaking, a value of the unresponsive time differs from product to product. Therefore, a commercially acceptable range (i.e., a range between allowable upper limit and lower limit times) of the unresponsive time is set. In the present embodiment, as the commercially acceptable range of the unresponsive time, a minimum time (i.e., a lower limit time) is 3 seconds, and a maximum time (i.e., an upper limit time) is 5 seconds. That is, in the case of taking into consideration variations in the unresponsive times between the products, it is assured that the BP 1 is not to be switched to the protection state until at least 3 seconds have passed after an overcurrent is detected in the BP 1. Also, it is assured that the BP 1 is to be switched to the protection state within 5 seconds at the latest from when the overcurrent is detected in the BP 1. Similarly, ideally speaking, it is also desirable that the return delay time is an equal and uniform value between products. However, realistically speaking, a value of the return delay time differs from product to product. Therefore, similarly to the unresponsive time, a commercially acceptable range (i.e., a range between allowable upper limit and lower limit times) of the return delay time is set. In the present embodiment, as the commercially acceptable range of the return delay time, a minimum time (i.e., a lower limit time) is 2 seconds, and a maximum time (i.e., an upper limit time) is 4 seconds. That is, the BP 1 is not to be switched to the normal state until at least 2 seconds have passed after a return condition is satisfied in the BP 1. Also, the BP 1 is to be switched to the protection state within 4 seconds at the latest from when the return condition is satisfied in the BP 1. All the values mentioned above are set so as to assure a safety operation. In other words, if a BP functions based on the values, it is determined that the BP satisfies the safety specification. Note that the design and manufacture (e.g., inspection) of products assure that the aforementioned variations in the unresponsive times and the return delay times between the products are included within the range between the minimum and maximum times (i.e., lower and upper limit times) of the unresponsive time and within the range between the minimum and maximum times (i.e., lower and upper limit times) of the return delay time, respectively.

The MPU 11 of the game apparatus 10 also recognizes the overcurrent detection value, the unresponsive time (its maximum and minimum times), and the return delay time (its maximum and minimum times), which are all set in the BP 1. In other words, the MPU 11 stores the overcurrent detection value, an allowable range between the maximum and minimum times (upper and lower limit times) of the unresponsive time, and an allowable range between the maximum and minimum times (upper and lower limit times) of the return delay time, which are all set in the BP 1.

In the BP specification checking process according to the present embodiment, when the BP 1 is attached to the game apparatus 10, the MPU 11 draws a predetermined amount of current from the BP 1 so as to cause the BP 1 to switch to the protection state. Then, an output voltage of the BP 1, for example, is monitored, thereby measuring a time required for causing the BP 1 to switch to the protection state, or a time required for causing the BP 1 to return to the normal state. Thereafter, the measured time required for causing the BP 1 to switch to the protection state is compared with the maximum and minimum times of the unresponsive time, and the measured time required for causing the BP 1 to return to the normal state is compared with the maximum and minimum times of the return delay time, thereby determining whether or not the BP 1 attached to the game apparatus 10 satisfies a predetermined safety specification. While the BP 1 is in the protection state, the game apparatus 10 is operated by using an electric charge charged in the capacitor 13.

Figure 4:
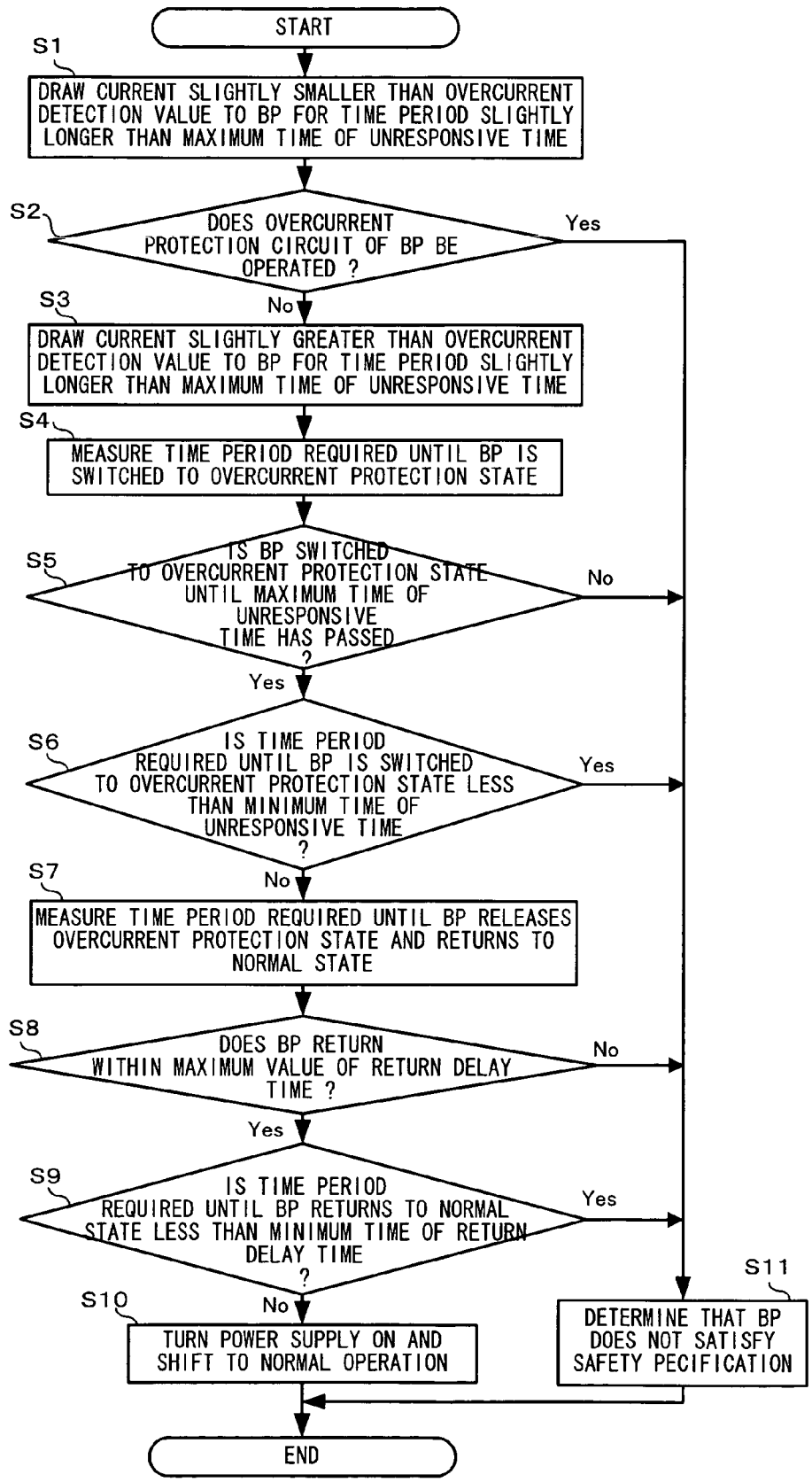
FIG. 4 is a flowchart showing the details of a battery pack specification checking process.

Hereinafter, referring to FIGS. 4 to 7, the BP specification checking process according to the present embodiment will be described in detail. FIG. 4 is a flowchart showing the details of the BP specification checking process. When the BP 1 is attached to the game apparatus 10, and a power supply switch of the game apparatus 10 is turned on, a process shown in FIG. 4 is performed. In FIG. 4, the MPU 11 sets, as a constant current value, a current of a value slightly smaller than the overcurrent detection value (0.9 A) in the constant current electronic load 12. Then, the current of the value slightly smaller than the overcurrent detection value (0.9 A) is drawn from the BP 1 for a time period slightly longer than the maximum time of the unresponsive time (step S1). In the present embodiment, a current of 0.8 A is drawn as the constant current value. Thus, the current of 0.8 A is drawn from the BP 1 for the maximum time of the unresponsive time. As a result, if the BP satisfies a safety specification, the BP is not to be switched to the protection state. On the other hand, if the BP is switched to the protection state while the current of 0.8 is drawn for the aforementioned time period, it is determined that the BP does not satisfy the safety specification. This is because such a BP is not a product having a safety confirmed by a manufacturer or license manufacturer of an electrical apparatus for which the BP is used. Thus, the BP is determined not to satisfy the safety specification, taking into consideration general problems other than an overcurrent. Therefore, the MPU 11 or a separately provided circuit monitors the output current of the BP 1, thereby detecting whether the BP 1 is to be switched to the overcurrent protection state while the current of 0.8 A is drawn. Thus, it becomes possible to determine whether or not the BP 1 attached to the game apparatus 10 satisfies the safety specification.

Figure 5:
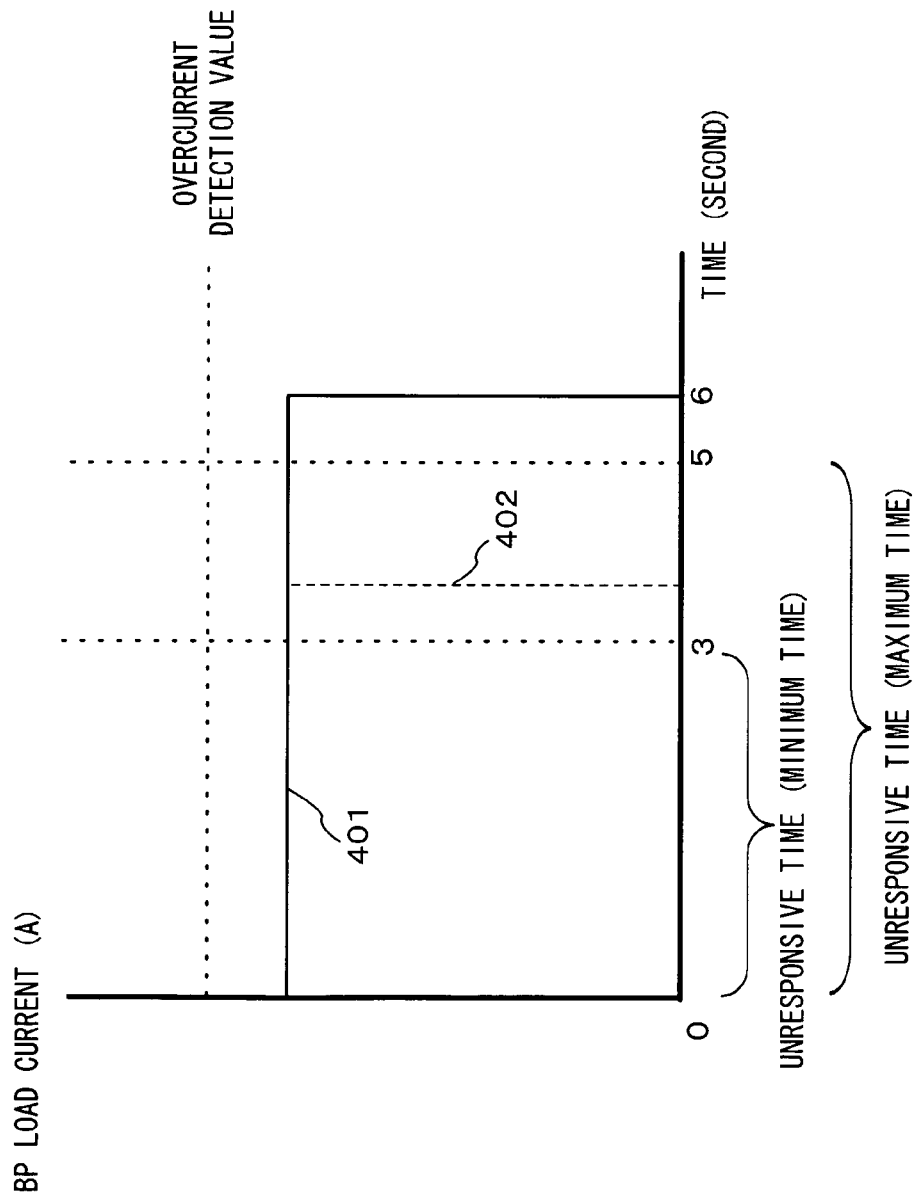
FIG. 5 is a diagram showing a relationship between a load current of the battery pack 1 and a time period required for causing the battery pack 1 to switch to a protection state.

Referring to FIGS. 1 and 5, an operation of the BP performed in step S1 will be more specifically described. If the BP 1 satisfies the safety specification, the current of 0.8 A passes through the MOS element 25 shown in FIG. 1, so as to be inputted to the positive terminal of the overcurrent detector 22. At this time, assuming that a resistance value of the MOS element 25 is 0.1Ω, a voltage inputted to the positive terminal is (0.1Ω+0.1Ω)×0.8 A=0.16V. As a result, the voltage inputted to the positive terminal does not exceed the reference voltage (0.18V) of the overcurrent detector 22. Therefore, the BP 1 is not to be switched to the protection state. However, if the BP 1 does not satisfy the safety specification, (e.g., in the case where the reference voltage of the overcurrent detector 22 is a low value such as 0.05V), a voltage inputted to the positive terminal exceeds the reference voltage of the overcurrent detector 22. Therefore, a status of a signal indicating a comparison result is reversed, and the signal indicating the comparison result is inputted to the control section 21 from the overcurrent detector 22. As a result, the control section 21 detects an overcurrent, and causes the BP 1 to switch to the protection state.

FIG. 5 is a diagram showing a relationship between a load current of the BP 1 and a time period required for causing the BP 1 to switch to the protection state. In FIG. 5, a current of a value slightly smaller than an overcurrent detection value 401 is drawn for 6 seconds (i.e., a time period corresponding to the maximum time of the unresponsive time and 1 second). If the BP 1 satisfies the safety specification, the BP 1 is not to be switched to the protection state while the current is drawn. Thus, a voltage outputted from the BP 1 is not to be changed until 6 seconds have passed. However, if the BP 1 does not satisfy the safety specification, the BP 1 may be changed to the protection state before 6 seconds have passed (402 of FIG. 4). Therefore, the MPU 11 can determine that the BP 1 attached to the game apparatus 10 does not satisfy the safety specification if the voltage outputted from the BP 1 is changed within 6 seconds.

Referring back to FIG. 4, after step S1 mentioned above, the MPU 11 monitors the voltage outputted from the BP 1, thereby determining whether or not the BP 1 is switched to the protection state until the maximum time of the unresponsive time has passed (step S2). As a result, if the BP 1 is switched to the protection state within the time period (YES in step S2), it is determined that the BP 1 attached to the game apparatus 10 does not satisfy the safety specification (step S11), and the BP specification checking process is finished. As a result, a power supply of the game apparatus 10 is not turned on, and thus the game apparatus 10 is not to be started. On the other hand, if the BP 1 is not switched to the protection state within the time period (NO in step S2), the MPU 11 advances the process to step S3.

Next, the MPU 11 draws a current of a value slightly greater than the overcurrent detection value from the BP 1 for a time period slightly longer than the maximum time of the unresponsive time (step S3). In the present embodiment, a current of 1 A, which is set in the constant current electronic load 12 as a constant current value, is drawn from the BP 1. Thereafter, the MPU 11 measures a time period required until the BP 1 is switched to the protection state (step S4). Then, the MPU 11 determines whether or not the BP 1 is switched to the protection state until the maximum time of the unresponsive time has passed (step S5). As a result, if the BP 1 is not switched to the protection state within the time period (NO in step S5), it is determined that the BP 1 attached to the game apparatus 10 does not satisfy the safety specification (step S11), and the BP specification checking process is finished. On the other hand, if the BP 1 is switched to the protection state within the time period (YES in step S5), the MPU 11 advances the process to step S6.

Next, the MPU 11 determines whether or not a time period required for causing the BP 1 to switch to the protection state is less than the minimum time of the unresponsive time (step S6). That is, it is determined whether the BP 1 is switched to the protection state too quickly. As a result, if the time period required for causing the BP 1 to switch to the protection state is less than the minimum time of the unresponsive time (YES in step S6), it is determined that the BP 1 attached to the game apparatus 10 does not satisfy the safety specification (step S11), and the BP specification checking process is finished. On the other hand, if the time period required for causing the BP 1 to switch to the protection state is more than or equal to the minimum time of the unresponsive time (NO in step S6), the MPU 11 advances the process to step S7.

Figure 6:
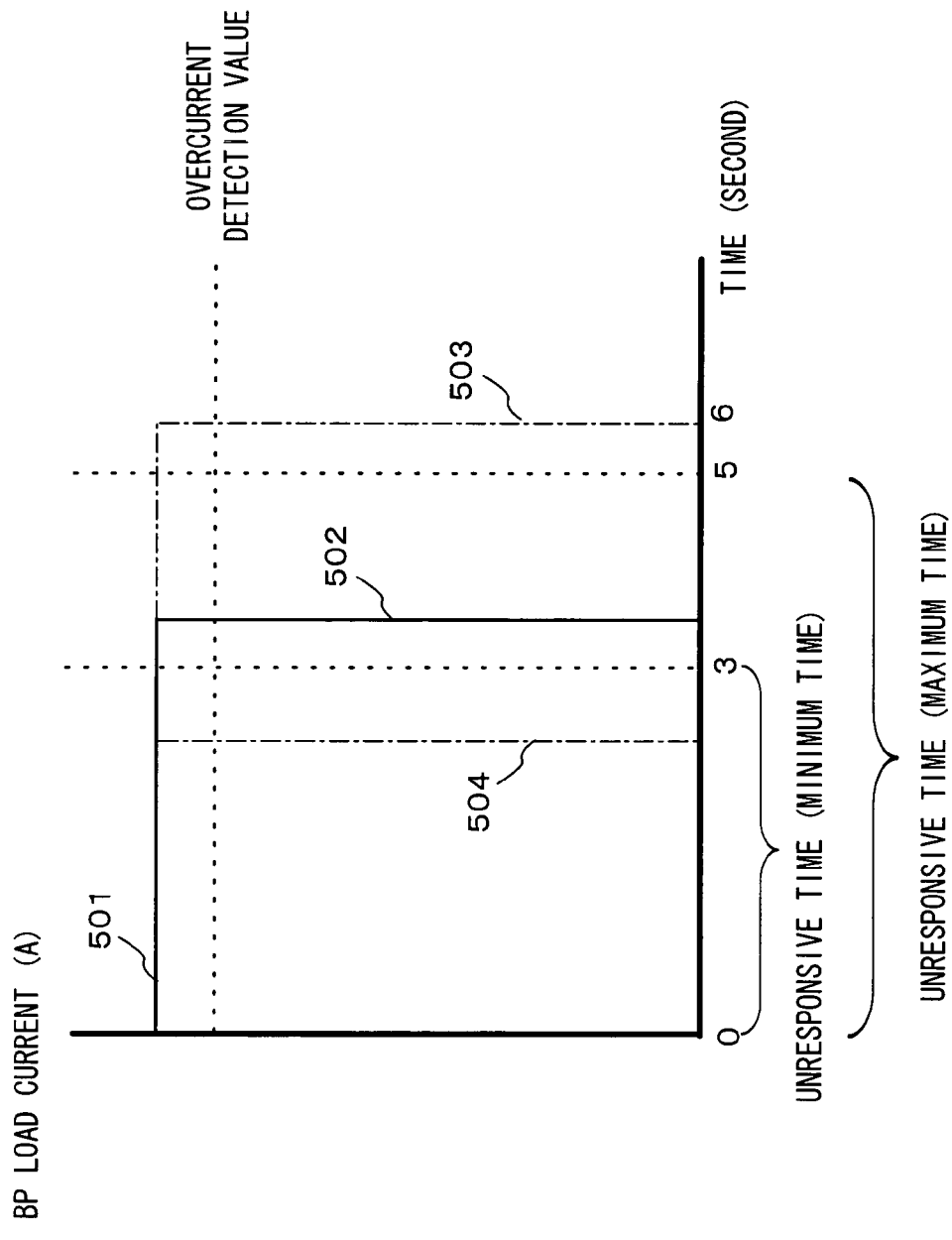
FIG. 6 is a diagram showing a relationship between a load current of the battery pack 1 and a time period required for causing the battery pack 1 to switch to the protection state.

Referring to FIGS. 1 and 6, a process performed from steps S3 to S6 will be more specifically described. FIG. 6 is a diagram showing a relationship between a load current of the BP 1 and a time period required for causing the BP 1 to switch to the protection state. In FIG. 6, a current of a value slightly greater than the overcurrent detection value 501 is drawn for 6 seconds (i.e., a time period corresponding to the maximum time of the unresponsive time and 1 second). If the BP 1 satisfies the safety specification, the BP 1 is to be switched to the protection state within a range between the minimum and maximum times of the unresponsive time. That is, a voltage outputted from the BP 1 is reduced to 0 within a range between 3 and 5 seconds after the current starts to be drawn (502 of FIG. 6). However, if the BP 1 does not satisfy the safety specification, the BP 1 is not switched to the protection state even after 6 seconds have passed (503 of FIG. 6), or the BP is switched to the protection state even before 3 seconds have passed (504 of FIG. 6). Therefore, the MPU 11 determines whether or not the BP 1 is switched to the protection state until the maximum time of the unresponsive time has passed. Or even when the BP 1 is switched to the protection state within the aforementioned time period, the MPU 11 determines whether or not the BP 1 is switched to the protection state after the minimum time of the unresponsive time has passed. Thus, it becomes possible to determine whether or not the BP 1 attached to the game apparatus 10 satisfies the safety specification. Note that realistically speaking, the overcurrent detection value differs from product to product. Therefore, similarly to the unresponsive time or the return delay time, allowable minimum and maximum values are generally set so as to determine an allowable range of the overcurrent detection value. Taking this into consideration, in step S1, a current of a value slightly smaller than the minimum value of the overcurrent detection value is preferably drawn. Also, in step S3, a current of a value slightly greater than the maximum value of the overcurrent detection value is preferably drawn.

Referring back to FIG. 4, after step S6, the MPU 11 measures a time period required until the BP 1 releases the protection state and returns to the normal state (step S7). Now, referring to FIG. 1, an operation performed in step S7 will be described in detail. When the BP 1 is firstly turned to the protection state, the MOS element 25 is set to be turned off. Therefore, a current path to be used is accordingly switched from the current path at the side of the negative power supply terminal 4b of the BP 1 to a current path in which the resistance 24 is located. At this time, the current of 1 A is drawn from the BP 1 in step S3 mentioned above. Thus, assuming that a GND of the current path at the side on the negative power supply terminal 4b is a reference level, a voltage applied to the resistance 24 is 4V (mathematically, the voltage is 1 A×100KΩ=100KV. However, because the voltage of the cell 3 is 4V, an upper limit value of the negative power supply terminal 4b is accordingly 4V when the GND of the current path at the side of the negative power supply terminal 4b is the reference level). As a result, a voltage of 4V is applied to each of the positive power supply terminal 4a and the negative power supply terminal 4b, thereby eliminating a potential difference therebetween. Specifically, when the GND of the current path at the side of the negative terminal is the reference level, a voltage of the power supply terminal 4b is 0V in the normal state. However, when the overcurrent protection operation is started and a current path to be used is accordingly switched to the current path in which the resistance 24 is located, the voltage applied to the negative power supply terminal 4b is changed, assuming that the GND of the current path at the side of the negative power supply terminal 4b is the reference level, to 4V, thereby eliminating the potential difference between the power supply terminals 4a and 4b. That is, the voltage outputted from the BP 1 is to be 0V. (At this time, a current outputted from the power supply terminal 4a of the BP 1 is 4V÷100KΩ=40 µA). Thereafter, the MPU 11, which has detected that the BP 1 is switched to the protection state, sets a current of 30 uA as a constant current value in the constant current electronic load 12, in order to release the protection state, thereby causing the constant current electronic load 12 to draw the current of 30 µAn from the BP 1. As a result, the voltage of the power supply terminal 4b of the BP 1 is to be 100KΩ (the resistance value of the resistance 24)×30 µA (a drawn current)=3V. Therefore, the potential difference between the power supply terminals 4a and 4b is generated, thereby causing the voltage outputted from the BP 1 to be 4V−3V=1V. Furthermore, the voltage of 3V is inputted to the positive terminal of the return detector 23 (100KΩ (the resistance value of the resistance 24)×30 µA (the drawn current)=3V). Because the voltage inputted to the positive terminal of the return detector 23 is less than the reference voltage (3.5V) thereof, a status of a signal indicating a comparison result is reversed, and the signal indicating the comparison result is inputted to the control section 21 from the overcurrent detector 23. The control section 21, to which the signal is inputted, waits for the return delay time previously set, and applies a voltage to the MOS element 25 after the return delay time has passed, thereby turning the MOS element 25 on. That is, at the instant when the voltage outputted from the BP 1 increases to 1V, the return detector 23 detects that the return condition is satisfied. However, the control section 21 releases the protection state only after the return delay time has passed. After the return delay time has passed, the control section 21 releases the protection state. As a result, the voltage outputted from the BP 1 is to be 4V. After detecting that the voltage outputted from the BP 1 is changed, the MPU 11 detects that BP 1 releases the protection state, and returns to the normal state. That is, the MPU 11 measures a time period from when a current of 30 uA is set as the drawn current to when the voltage outputted from the BP 1 is changed, thereby making it possible to detect a time period required until the BP 1 returns to the normal state (i.e., the return delay time). Note that in step S7 mentioned above, the MPU 11 releases the overcurrent protection state of the BP 1. That is, the process performed in step S7 by the MPU 11 functions as an overcurrent protection releasing section operable to return the BP to a state where the BP can supply an electric power to the game apparatus.

Next, referring back to FIG. 4, the MPU 11 determines whether or not the measured return delay time is less than or equal to the maximum time (4 seconds) of the return delay time (step S8). As a result, when the measured return delay time is more than the maximum time of the return delay time (NO in step S8), it is determined that the BP 1 attached to the game apparatus 10 does not satisfy the safety specification (step S11), and the BP specification checking process is finished. On the other hand, the measured return delay time is less than or equal to the maximum time (YES in step S8) of the return delay time, the MPU 11 advances the process to step S9.

Then, the MPU 11 determines whether or not the measured return delay time is less than the minimum time (2 seconds) of the return delay time (step S9). As a result, when the measured return delay time is less than the minimum time of the return delay time (YES in step S9), the MPU 11 determines that the BP 1 attached to the game apparatus 10 does not satisfy the safety specification (step S11), and finishes the BP specification checking process. On the other hand, when the measured return delay time is more than or equal to the minimum time of the return delay time (NO is step S9), the MPU 11 determines that the BP 1 attached to the game apparatus 10 satisfies the safety specification (step S10). Thereafter, the MPU 11 transmits a signal for turning the MOS-FET 14 on. As a result, the MOS-FET 14 is switched to be turned on, thereby causing the BP 1 to start to pass a current to the game apparatus main body section 15. Thus, the power supply of the game apparatus 10 is turned on, and the game apparatus 10 shifts to a normal operation. That is, until it is determined in the BP specification checking process that the BP 1 satisfies the safety specification, the MOS-FET 14, acting as an electric power limiting section operable to limit a current passing between the BP 1 and the game apparatus 10, limits (stops) the current passing therebetween. When it is determined that the BP 1 satisfies the safety specification, an electric power limiting state of the MOS-FET 14 is released, and a current starts to pass from the BP 1 to the game apparatus 10. As such, the BP specification checking process according to the first embodiment is finished.

Figure 7:
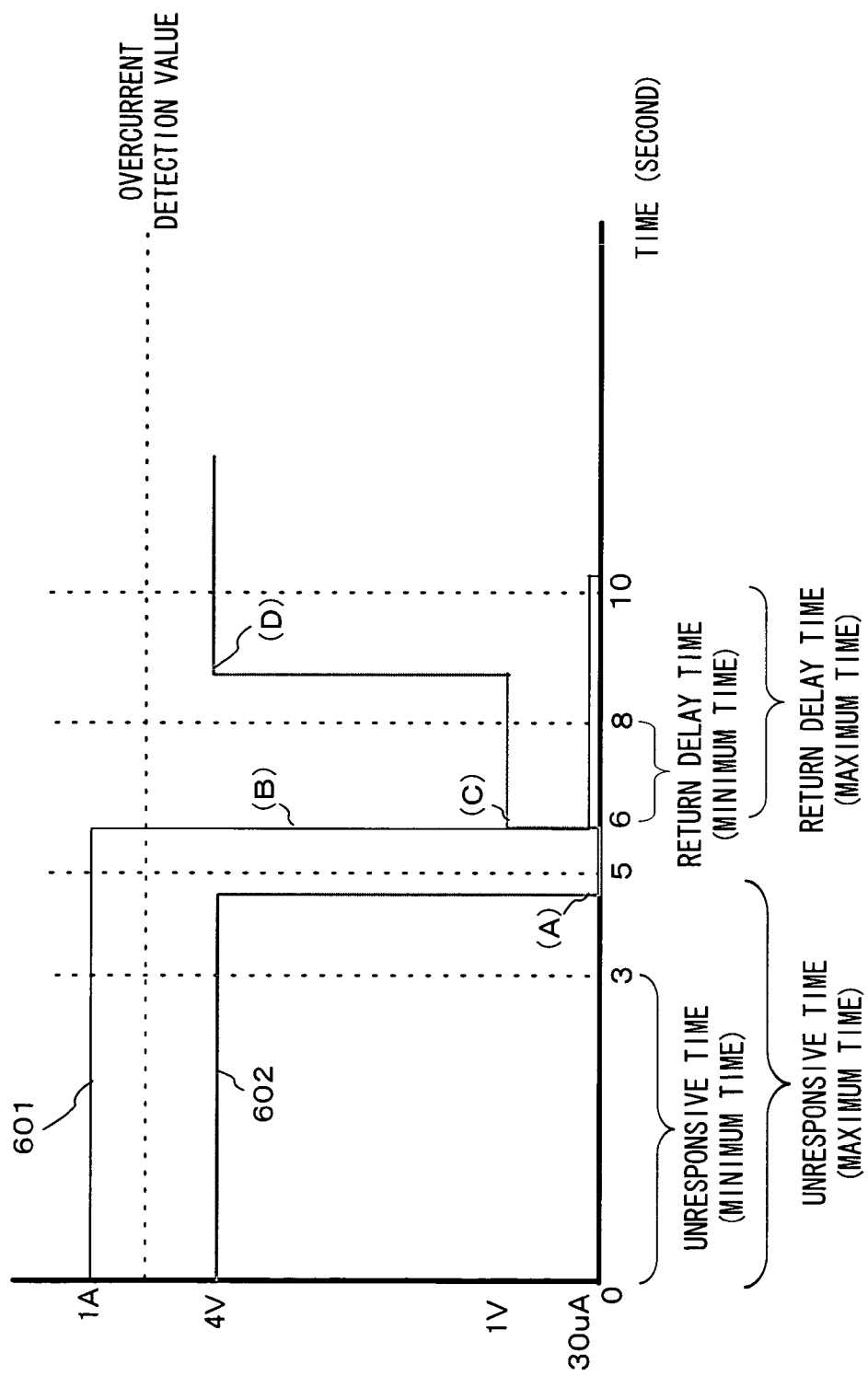
FIG. 7 is a diagram showing a relationship between a return delay time, a drawn current 601 of the hand-held game apparatus 10, and an output voltage 602 of the battery pack 1.

Referring to FIG. 7, a process performed in steps S7 to S9 will be more specifically described. FIG. 7 is a diagram showing a relationship between the return delay time, a drawn current 601 of the game apparatus 10, and an output voltage 602 of the BP 1. Firstly, the current 601 greater than the overcurrent detection value is drawn from the BP 1. Thereafter, as described above, the BP 1 is switched to the protection state, thereby causing the output voltage 602 of the BP 1 to be 0V ((A) of FIG. 7). Then, in order to release the protection state, the game apparatus 10 sets 30 µA as the constant current value, and draws the drawn current 601 from the BP 1 ((B) of FIG. 7). As a result, the output voltage 602 of the BP 1 increases to 1V ((C) of FIG. 7). Thereafter, a state where the output voltage 602 of the BP 1 is 1V continues until at least the minimum time (2 seconds) of the return delay time has passed. After the minimum time of the return delay time has passed, the protection state of the BP 1 is released, thereby causing the output voltage 602 of the BP 1 to return to 4V. If the BP 1 returns to the normal state within the range between the maximum and minimum times of the return delay time (i.e., 2 to 4 seconds after the return condition is satisfied), it can be determined that the BP 1 satisfies the safety specification. On the other hand, if the BP 1 does not return to the normal state within the range between the maximum and minimum times of the return delay time, or even after the maximum time of the return delay time has passed, it can be determined that the BP 1 does not satisfy the safety specification.

As described above, in the present embodiment, the predetermined value, which satisfies the safety specification, is previously set as each of the overcurrent detection value, the unresponsive time and the return delay time. When the BP 1 is attached to the game apparatus 10, a current is drawn from the BP 1 so as to cause the overcurrent protection circuit 2 to be operated. Thereafter, an operation of the overcurrent protection circuit 2 is detected based on a change in the output voltage of the BP 1, for example, and measured unresponsive time and return delay time are compared with the unresponsive time and return delay time which are previously set, respectively, thereby making it possible to determine whether or not the BP 1 attached to the game apparatus 10 satisfies a predetermined safety specification. Therefore, even if the BP 1 attached to the game apparatus 10 does not satisfy the predetermined safety specification, the power supply of the game apparatus 10 is not turned on. Thus, even if the BP 1 which does not satisfy the safety specification is used, a heat generation of the BP or the game apparatus 10 can be prevented. Furthermore, because a conventional overcurrent protection circuit can be used as the overcurrent protection circuit 2, it is not necessary to additionally include a special function such as an exclusive circuit in the BP 1. Thus, no extra cost is required. Still furthermore, only two terminals (i.e., the positive and negative power supply terminals) are required as a contact terminal, thereby improving a contact reliability. Note that in the present embodiment, a current of a value slightly greater than the overcurrent detection value is drawn. However, the overcurrent detection value is set so as to include a substantial margin in which a safety is assured. Thus, no safety problem occurs even when the current of the value slightly greater than the overcurrent detection value is drawn.

Next, referring to FIGS. 8 and 9, a second embodiment according to the present invention will be described. In the first embodiment, no communication is performed between the game apparatus and the BP. In contrast, in the second embodiment, a function of performing a communication between the game apparatus and the BP is provided, thereby more safely performing the BP specification checking process.

An operation according to the second embodiment will be briefly described. In the first embodiment, only one overcurrent detection value is provided. In contrast, in the second embodiment, two overcurrent detection values are provided. A first overcurrent detection value is a value used for protecting the BP when an overcurrent is detected during the normal operation (hereinafter, referred to as a "normal detection value"). The normal detection value indicates a value of a current which causes the overcurrent protection circuit to be operated. Thus, a relatively large value (e.g., 0.8 A) is set as the normal detection value. A second overcurrent detection value is a value used only when the BP specification checking process is performed (hereinafter, referred to as a "check detection value"). A value less than the normal detection value (e.g., 0.08 A) is set as the check detection value.

In the second embodiment, the aforementioned two overcurrent detection values are used depending on an operation mode. Therefore, two operation modes are provided in the BP. In the two operation modes, capacities in which the BP can supply currents to the exterior thereof are different from each other. A first operation mode indicates a state where the BP can supply a current by using a primary current supply capacity (hereinafter, referred to as a "normal mode"). A second operation mode indicates a state where a capacity in which the BP can supply a current to the exterior thereof is limited (hereinafter, referred to as a "limited mode"). When the BP is not attached to the game apparatus, the BP is set to be in the limited mode. Then, in the BP specification checking process, the process similar to that in the first embodiment is performed by using the check detection value, thereby checking a specification of the BP. After it is determined in the BP specification checking process that the BP satisfies the safety specification, an operation mode of the BP is switched to the normal mode from the limited mode. In the normal mode, an overcurrent is detected based on the normal detection value.

Second Embodiment

Hereinafter, the second embodiment according to the present invention will be described in detail with reference to the drawings. FIG. 8 is a diagram illustrating a structure of a BP 50 according to the second embodiment of the present invention. The BP 50 has the same structure as that of the BP 1 described in the first embodiment with reference to FIG. 1 except that the BP 50 additionally includes a communication terminal 6, a serial communication control section 26, an overcurrent detection value setting resister 27, an ON/OFF control circuit 28, a MOS element 29, a reference voltage control circuit 30, an unresponsive time setting resister 31, a return delay time setting resister 32, a resistance 33, and a resistance 34. Therefore, the same elements, other than the aforementioned elements additionally included in the BP 50, as those included in the BP 1 in the first embodiment will be denoted by same reference numerals and will not be further described below.

Figure 9:
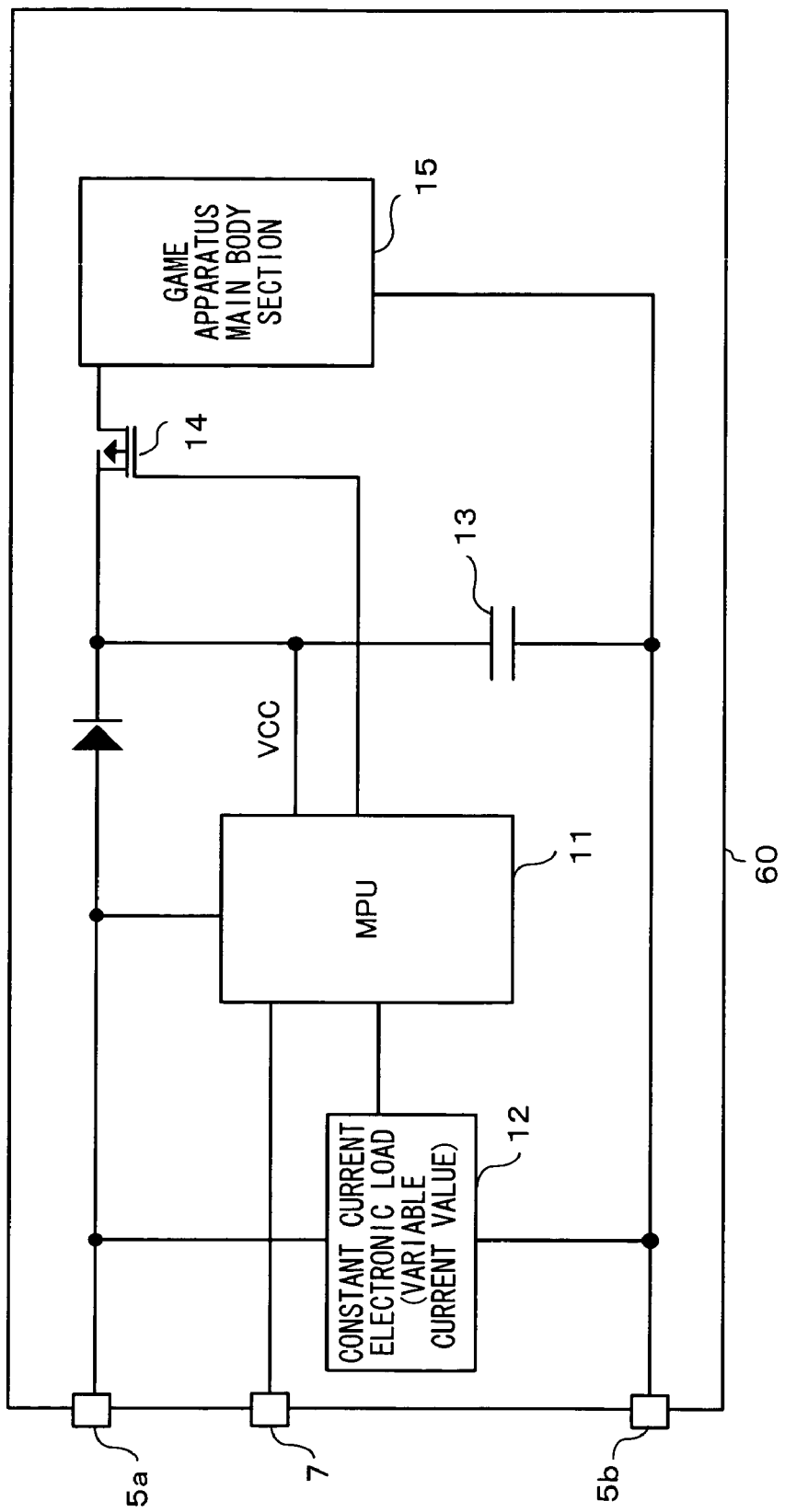
FIG. 9 is a diagram illustrating a structure of a hand-held game apparatus 60 according to the second embodiment of the present invention.

FIG. 9 is a diagram illustrating a structure of a game apparatus 60 according to the second embodiment of the present invention. The game apparatus 60 according to the second embodiment has the same structure as that of the game apparatus 10 described in the first embodiment with reference to FIG. 3 except that the game apparatus 60 additionally includes a communication terminal 7. Therefore, the same elements, other than the aforementioned element additionally included in the game apparatus 60, as those included in the game apparatus 10 in the first embodiment will be denoted by same reference numerals and will not be further described below. Note that in the present embodiment, a one-way communication is performed from the game apparatus 60 to the BP 50.

Figure 8:
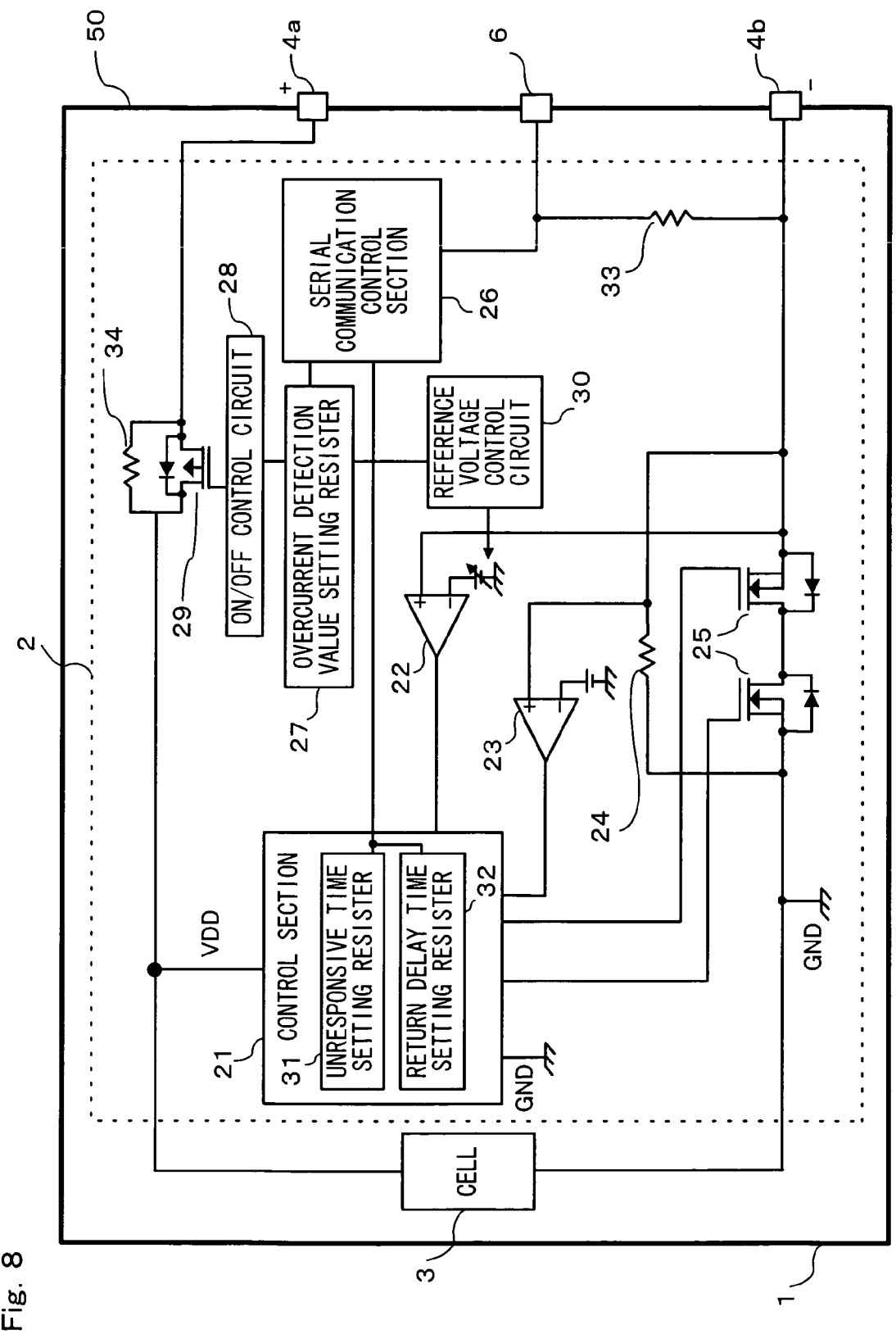
FIG. 8 is a diagram illustrating a structure of a battery pack 50 according to a second embodiment of the present invention.

In FIG. 8, the communication terminal 6 is operable to perform a communication with the game apparatus 60. The serial communication control section 26 is operable to change a value of the overcurrent detection value setting resister 27, based on a voltage level (an L level or an H level) of the communication terminal 6, or a command transmitted from the game apparatus 60. Also, the serial communication control section 26 is operable to change, based on the command transmitted from the game apparatus 60, a value of the unresponsive time setting resister 31 and a value of the return delay time setting resister 32, both of which will be described later.

The overcurrent detection value setting resister 27 is operable to indicate a setting of the two overcurrent detection values mentioned above. In the present embodiment, when the value of the overcurrent detection value setting resister 27 is 0, the check detection value is set. On the other hand, the value of the overcurrent value setting resister 27 is 1, the normal detection value is set. Note that the voltage level of the communication terminal 6 included in the BP 50 is maintained in the L level for a constant period of time, the serial communication control section 26 causes the value of the overcurrent detection value setting resister 27 to be 0. That is, 0 is set as an initial value in the overcurrent detection value setting resister 27.

The ON/OFF control circuit 28 is operable to control the on/off states of the MOS element 29 based on the value of the overcurrent detection value setting resister 27. Specifically, when the value of the overcurrent detection value setting resister 27 is 0, the MOS element 29 is set to be turned off. On the other hand, when the value of the overcurrent detection value setting resister 27 is 1, the MOS element 29 is set to be turned on.

The MOS element 29 is set to be turned either on or off in accordance with an operation of the ON/OFF control circuit 28. When the MOS element 29 is set to be turned off, a capacity in which the BP 50 can supply a current to the exterior thereof is limited by the resistance 34. That is, when the MOS element 29 is set to be turned off, the limited mode is set as the operation mode. On the other hand, when the MOS element 29 is set to be turned on, the normal mode is set as the operation mode.

The reference voltage control circuit 30 switches the reference voltage (i.e., the overcurrent detection value) of the overcurrent detector 22 between two values, based on the value of the overcurrent detection value setting resister 27. In other words, the reference voltage of the overcurrent detector 22 is a variable reference voltage which can be switched between the two values.

The unresponsive time setting resister 31 is operable to change a value, of the unresponsive time, which is previously set in the control section 21. In accordance with a command transmitted from the serial communication control section 26, a value of the unresponsive time setting resister 31 is changed. Accordingly, the value, of the unresponsive time, which is previously set in the control section 21, is to be changed.

The return delay time setting resister 32 is operable to change a value, of the return delay time, which is previously set in the control section 21. In accordance with the command transmitted from the serial communication control section 26, a value of the return delay time setting resister 32 is changed. Accordingly, the value, of the return delay time, which is previously set in the control section 21, is to be changed.

The resistance 33 is a pull-down resistance for fixing a voltage level of the communication terminal 6 to the L level when the BP 50 is not attached to the game apparatus 60 (i.e., when the BP 50 functions in an individual manner).

In FIG. 9, the communication terminal 7 is operable to perform a communication with the BP 50. Specifically, when it is determined in the BP specification checking process that the BP 50 satisfies a safety specification, a command for switching the operation mode from the limited mode to the normal mode is transmitted to the serial communication control section 26 of the BP 50 through the communication terminal 7.

In the structure described above, a BP specification checking process to be described below is performed between the BP 50 and the game apparatus 60. When the BP 50 is firstly attached to the game apparatus 60, the voltage level of the communication terminal 6 included in the BP 50 is switched from the L level to the H level. When the voltage level of the communication terminal 6 is maintained in the H level for the constant period of time, a communication circuit (not shown) of the BP 50 is activated, thereby allowing the BP 50 to perform a communication with the game apparatus 60.

Thereafter, the BP specification checking process which is similar to that described in the first embodiment with reference to FIG. 3 is performed. At this time, the MOS element 29 is turned off. Therefore, the BP specification checking process is performed by using the check detection value (e.g., 0.08 A) as the overcurrent detection value. As a result, when it is determined that the BP 50 satisfies the safety specification, the MPU 11 transmits, to the serial communication control section 26, a command for changing the value of the overcurrent detection value setting resister 27 to 1. Accordingly, the serial communication control section 26 sets the value of the overcurrent detection value setting resister 27 to be 1. Then, the ON/OFF control circuit 28 turns the MOS element 29 on. Also, the reference voltage control circuit 30 switches the reference voltage of the overcurrent detector 22 to a reference voltage used in the normal mode. That is, the overcurrent detection value is changed to the normal detection value (e.g., 0.8 A). Thus, the operation mode of the BP 50 is accordingly switched to the normal mode. Thereafter, the MPU 11 turns a power supply of the game apparatus 60 on, and the game apparatus 60 shifts to a normal operation. As such, the BP specification checking process according to the second embodiment is finished.

With the aforementioned structure, in the BP specification checking process performed when the BP 50 is attached to the game apparatus 60, a safety of the BP 50 can be checked by using a current of a small value. Therefore, no extra load current is applied to the BP 50, thereby improving the safety of the BP 50. Furthermore, a capacity of the BP 50 can be prevented from being reduced. When the BP 50 is not attached to the game apparatus 60, a current supply capacity of the BP 50 can be limited. Therefore, when the BP 50 alone is carried around, it becomes possible to prevent an electric shock or the like.

Note that before the BP specification checking process starts to be performed, commands for changing the unresponsive time and the return delay time may be transmitted from the game apparatus 60 to the BP 50. Specifically, the MPU 11 transmits the commands for changing the unresponsive time and the return delay time to the serial communication control section 26. Based on the commands, the serial communication control section 26 sets a predetermined value as the value of each of the unresponsive time setting resister 31 and the return delay time setting resister 32. Thus, if the BP 50 has the aforementioned structure, the values of the unresponsive time and the return delay time, which are previously set in the control section 21, are to be changed accordingly. On the other hand, if the BP does not have the aforementioned structure or has a different command system, the values of the unresponsive time and the return delay time, which are previously set in the control section 21, are not to be changed. Then, the MPU 11 performs the BP specification checking process based on the changed values of the unresponsive time and the return delay time. As a result, if the BP 50 has the aforementioned structure (i.e., the BP 50 satisfies the safety specification), an operation is performed in accordance with the changed values of the unresponsive time and the return delay time. On the other hand, the BP does not have the aforementioned structure (i.e., the BP does not satisfy the safety specification), the operation is not performed in accordance with the changed values of the unresponsive time and the return delay time. Thus, even if a BP, not satisfying the entirety of the safety specification, accidentally has values, of the unresponsive time and the return delay time, similar to those set in a BP satisfying the safety specification as initial values, a safety of such a hazardous BP can be more strictly checked.

Alternatively, the BP specification checking process may be repeatedly performed a plurality of times, by changing the values of the unresponsive time and the return delay time each time the BP specification checking process is performed (e.g., the initial values of the unresponsive time and the return delay time are used when the BP specification checking process is initially performed, and then the changed values thereof are used when the BP specification checking process is subsequently performed). Thus, it becomes possible to more strictly check the safety of the BP. Note that in the present embodiment, the communication terminals 6 and 7 are used for performing a communication between the game apparatus 60 and the BP 50. However, instead of using the communication terminals 6 and 7, the power supply terminals 4a and 5a may be used in order to perform the communication between the game apparatus 60 and the BP 50. In such a case, the MPU 11 changes a current value set in the constant current electronic load 12, thereby generating changes in the currents and voltages applied to the power supply terminals 4a and 5a.

Then, the MPU 11 generates a digital signal based on the changes, thereby making it possible to realize a desired communication between the game apparatus 60 and the BP 50.

Third Embodiment

Figure 10:
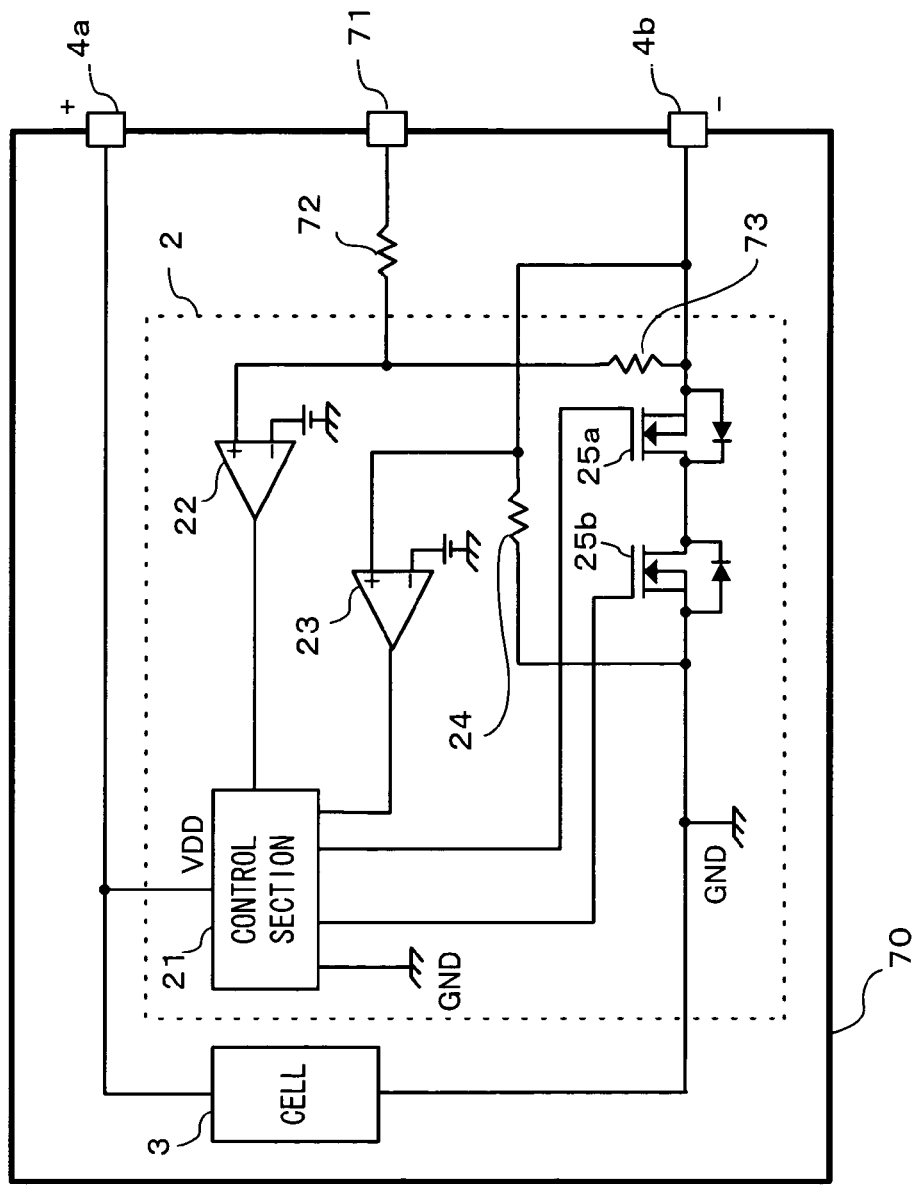
FIG. 10 is a diagram illustrating a structure of a battery pack 70 according to a third embodiment of the present invention.

Next, a third embodiment of the present invention will be described in detail with reference to the drawings. FIG. 10 is a diagram illustrating a structure of a BP 70 according to the third embodiment. The BP 70 has the same structure as that of the BP 1 described in the first embodiment with reference to FIG. 1 except that the BP 70 additionally includes a test terminal 71, a resistance 72, and a resistance 73. Therefore, the same elements, other than the aforementioned elements additionally included in the BP 70, as those included in the BP 1 in the first embodiment will be denoted by same reference numerals and will not be further described below.

The resistance 73 is necessary to cause, when a voltage is applied from the test terminal 71, a voltage of the positive terminal of the overcurrent detector 22 to be higher than that of the negative terminal of the overcurrent detector 22. The resistance 72 may not be provided. However, the resistance 72 is necessary when it is not preferable that a voltage higher than or equal to the reference voltage of the overcurrent detector 22 is applied to the positive terminal of the overcurrent detector 22. Note that the test terminal 71 is connected through the resistance 72 to the positive terminal of the overcurrent detector 22 used for detecting an overcurrent. The overcurrent detector 22, operable to detect the overcurrent, compares a voltage between the GND of the BP and the MOS element 25a with the reference voltage of the overcurrent detector 22 in the normal state (i.e., in a state where the overcurrent protection operation is not performed, and the overcurrent detector 22 monitors an overcurrent).

Figure 11:
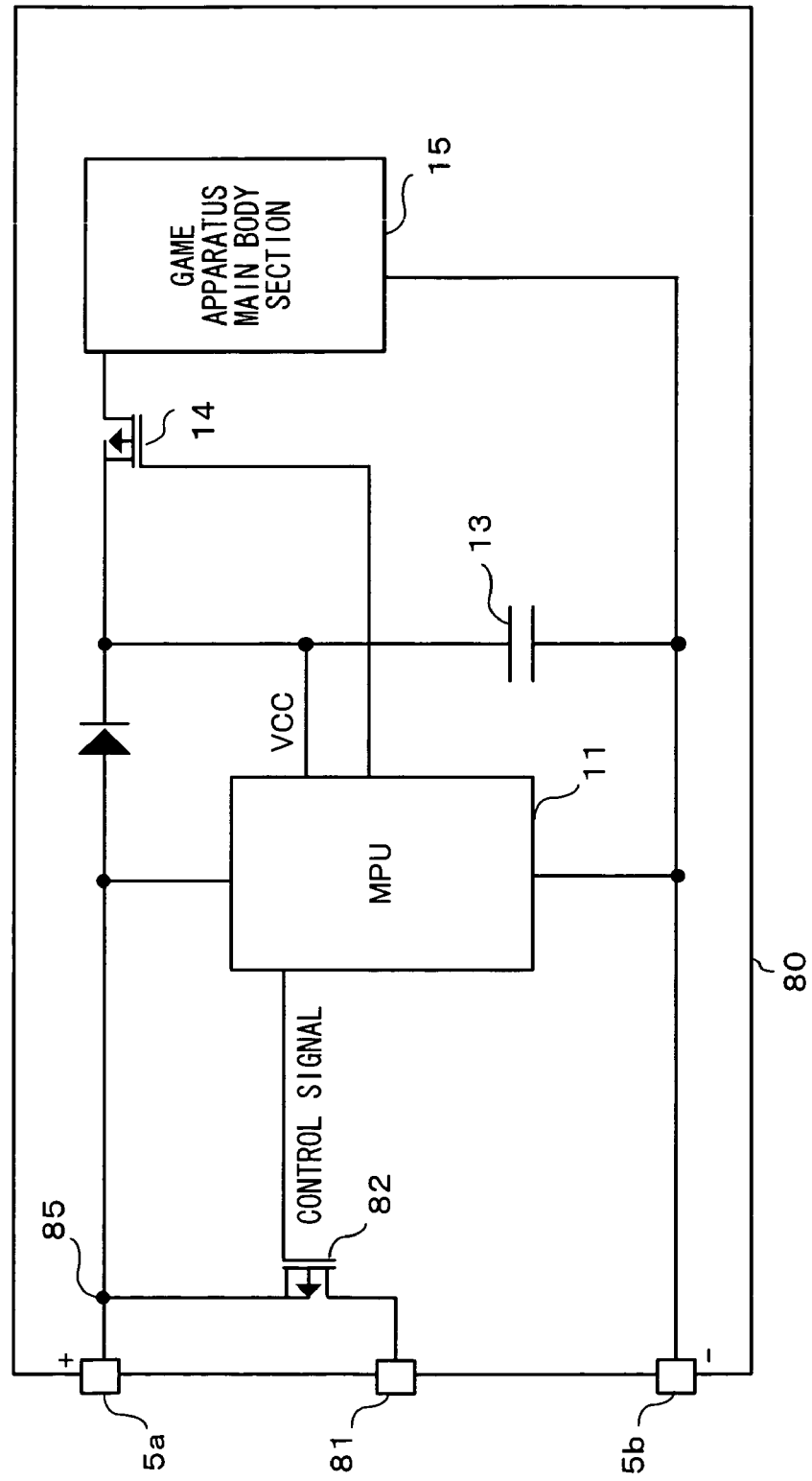
FIG. 11 is a diagram illustrating a structure of a hand-held game apparatus 80 according to the third embodiment of the present invention.

FIG. 11 is a diagram illustrating a structure of a game apparatus 80 according to the third embodiment of the present invention. The game apparatus 80 according to the third embodiment has the same structure as that of the game apparatus 10 described in the first embodiment with reference to FIG. 3 except that the constant current electronic load 12 of the game apparatus 10 is replaced with a test terminal 81 and a MOS-FET 82, both of which are additionally included in the game apparatus 80. Therefore, the same elements, other than the test terminal 81 and the MOS-FET 82 additionally included in the game apparatus 80, as those included in the game apparatus 10 in the first embodiment will be denoted by same reference numerals and will not be further described below.

In FIG. 10, the test terminal 71 is operable to apply a voltage so as to cause the overcurrent detector 22 to detect an overcurrent. The resistances 72 and 73 are located in a current path in which the test terminal 71 and the negative power supply terminal 4b are connected to each other, and connection points of the resistances 72 and 73 are connected to the positive terminal of the overcurrent detector 22. In FIG. 11, the test terminal 81 is connected to the test terminal 71. The test terminal 81 is also connected to the power supply terminal 5a through the MOS-FET 82. Furthermore, a control signal outputted from the MPU 11 is inputted to the MOS-FET 82. In the third embodiment having the aforementioned structure, instead of performing an operation, as described above in the first embodiment, of drawing a current to a game apparatus, a voltage is applied to the test terminal 71 so as to cause the overcurrent detector 22 to detect an overcurrent, thereby causing the BP 70 to perform an overcurrent protection operation.

Figure 12:
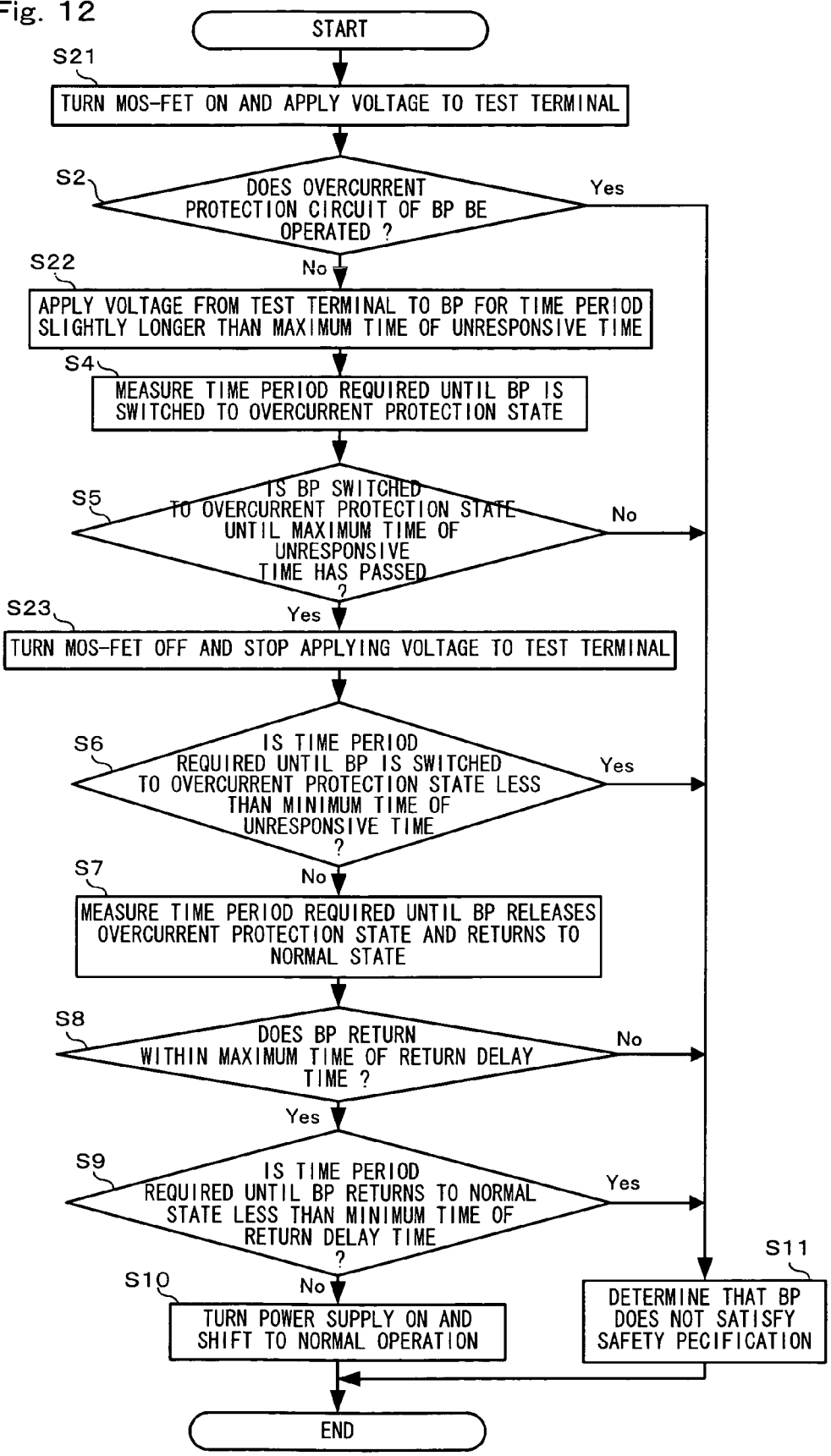
FIG. 12 is a flowchart showing the details of a battery pack specification checking process according to the third embodiment.

Hereinafter, referring to FIG. 12, a BP specification checking process according to the third embodiment will be described in detail. FIG. 12 is a flowchart showing the details of the BP specification checking process according to the third embodiment. When the BP 70 is attached to the game apparatus 80 (in this state, the power supply terminals 5a and 5b contact the power supply terminals 4a and 4b, respectively, and the test terminal 71 contacts the test terminal 81), and a power supply of the game apparatus 80 is turned on, the BP 70 supplies an electric power from the power supply terminals 4a and 4b to the power supply terminals 5a and 5b, thereby causing the MPU 11 to start an operation, and perform a process shown in FIG. 12.

In FIG. 12, the MPU 11 firstly performs a process of applying a voltage to the test terminal 71 (step S21). Specifically, the MPU 11 outputs a control signal for turning the MOS-FET 82 on. As a result, the MOS-FET 82 is turned on. When the MOS-FET 82 is turned on, a voltage applied to the power supply terminal 5a from the BP 70 is to be applied to the test terminal 71 of the BP 70 through the test terminal 81 of the game apparatus 80. That is, a voltage of a value similar to that of a value of the positive power terminal 4a included in the BP 70 branches at a point 85 shown in FIG. 11, and is applied to the test terminal 71 of the BP 70. By applying such a voltage to the test terminal 71, a potential of the positive terminal of the overcurrent detector 22 exceeds a potential of the negative terminal of the overcurrent detector 22 (as a matter of course, a reference voltage inputted to the negative terminal of the overcurrent detector 22 is set so as to be lower than a voltage outputted from the BP). As a result, a voltage level of a voltage outputted from the overcurrent detector 22 is to be the H level, and the control section 21 determines that an overcurrent has flowed in a similar manner to the first embodiment. Note that in the present embodiment, a voltage outputted from the BP 70 is applied to the test terminal 71 through the test terminal 81. However, a voltage output section may be separately provided so as to apply a voltage to the test terminal 81 from the voltage output section.

Next, similarly to the first embodiment, the process, of determining whether or not the BP 70 is switched to the protection state until the maximum time of the unresponsive time has passed, is performed (step S2). As a result, when the BP 70 is switched to the protection state within the time period (YES in step S2), it is determined that the BP 70 attached to the game apparatus 80 does not satisfy the safety specification (step S11), and the BP specification checking process is finished. Note that the process performed in step S2 may be omitted.

On the other hand, when the BP 70 is not switched to the protection state within the time period (NO in step S2), the voltage continues to be applied to the BP 70 for a time period slightly longer than the maximum time of the unresponsive time (step S22). As a result, if the BP 70 satisfies the safety specification, the BP 70 is switched to the protection state until the maximum time of the unresponsive time has passed. After the BP 70 is switched to the protection state within the aforementioned time period, a process of determining whether or not the BP 70 satisfies the safety specification is performed in a similar manner to that in the first embodiment. Specifically, the MPU 11 measures a time period required until the BP 70 is switched to the protection state (steps S4 and S5). As a result, if the BP 70 is switched to the protection state until the maximum time of the unresponsive time has passed (YES in step S5), the MPU 11 outputs a control signal for turning the MOS-FET 82 off (step S23). As a result, the MOS-FET 82 is turned off, thereby stopping the voltage applied to the test terminals 71 and 81.

After step S23, similarly to the first embodiment mentioned above, the process, of determining whether or not the BP 70 is switched to the protection state within the minimum time of the unresponsive time, is performed (step S6), and then the return delay time is measured (steps S7 to S9). As a result, if the BP 70 returns to the normal state within the predetermined return delay time (NO in step S9), the MPU 11 determines that the BP 70 attached to the game apparatus 80 satisfies the safety specification (step S10). Thereafter, the MPU 11 turns the MOS-FET 14 on, thereby starting to pass a current to the game apparatus main body section 15. Then, the power supply of the game apparatus 80 is turned on, and the game apparatus 80 shifts to a normal operation. On the other hand, if the measured return delay time does not satisfy the aforementioned predetermined conditions (YES in step S6, NO in step S8, and YES in step S9), it is determined that the BP 70 does not satisfy the safety specification (step S11), and the SP specification checking process is finished. As a result, the power supply of the game apparatus 80 is not turned on, and thus the game apparatus 80 is not to be started. Note that the process performed in steps S6 to S9 may be omitted.

Figure 13:
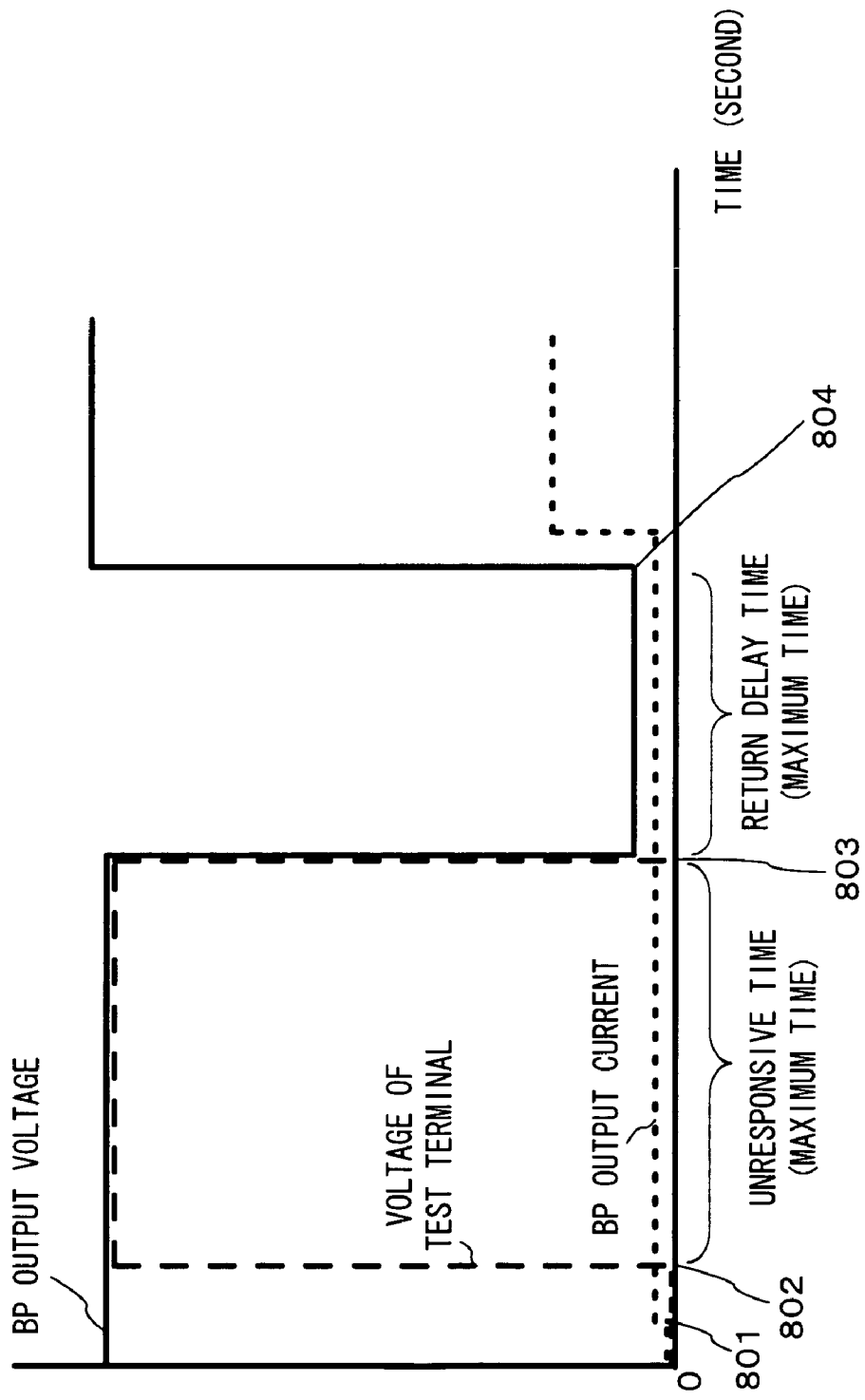
FIG. 13 is a timing chart showing changes in voltages of the hand-held game apparatus 80 and the battery pack 70 according to the third embodiment.

Referring to FIG. 13, the process according to the third embodiment will be more specifically described. FIG. 13 is a timing chart showing changes in voltages of the game apparatus 80 and the BP 70 according to the third embodiment. In FIG. 13, when the power supply of the game apparatus 80 is firstly turned on (801 of FIG. 13), a voltage is applied to the test terminals 81 and 71 (802 of FIG. 13). As described above, a value of the voltage is similar to that of a voltage outputted from the BP 70. As a result, if the BP 70 satisfies the safety specification, the BP 70 is switched to the overcurrent protection state after the maximum time of the unresponsive time has passed. Accordingly, the voltage applied to the test terminals 71 and 81 is to be stopped (803 of FIG. 13). Then, until the maximum time of the return delay time has passed, the overcurrent protection state is released (804 of FIG. 13), and an electric power starts to be supplied to the game apparatus 80 so as to perform the normal operation.

As described above, in the third embodiment, instead of performing an operation of drawing a current, a voltage is applied to the test terminal so as to cause the BP to be in the overcurrent protection state, thereby performing the process of determining whether or not the BP satisfies a safety specification. Therefore, the operation of drawing an overcurrent is not necessarily required. Thus, it becomes possible to more safely perform the BP specification checking process.

Figure 14:
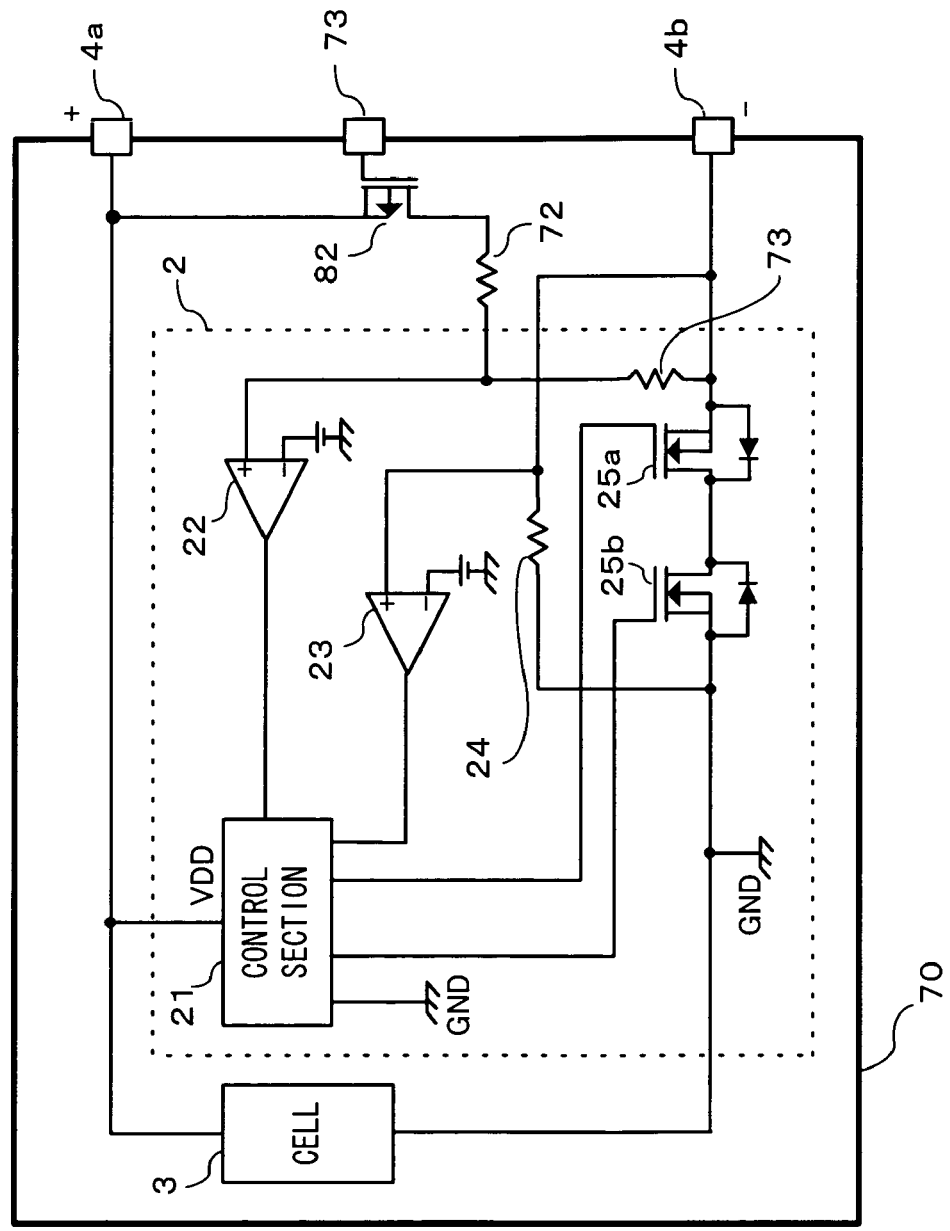
FIG. 14 is a diagram illustrating an exemplary structure of the battery pack 70.
Figure 15:
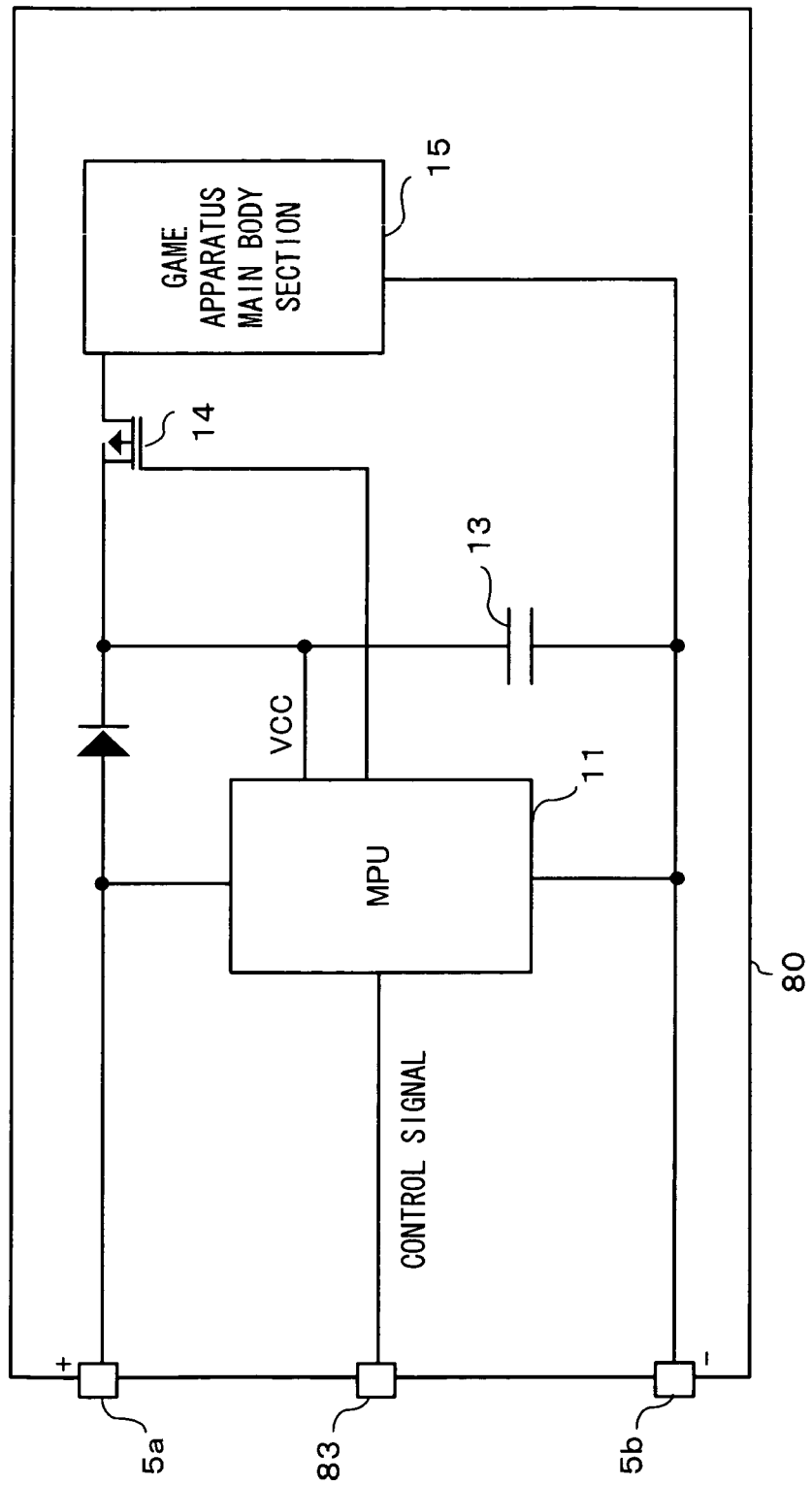
FIG. 15 is a diagram illustrating an exemplary structure of the hand-held game apparatus 80.

Alternatively, as shown in FIGS. 14 and 15, the MOS-FET 82 may be provided in the BP 70. In such a case, a communication terminal 83 and a communication terminal 73 are additionally provided in the game apparatus 80 and the BP 70, respectively. When the BP 70 is attached to the game apparatus 80 and the power supply of the game apparatus 80 is turned on, the MPU 11 may transmit the aforementioned control signal to the MOS-FET 82 through the communication terminals 83 and 73.

Still alternatively, a signal indicating an overcurrent state may be directly transmitted to the control section 21 of the BP 70 without being passed through the overcurrent detector 22 (e.g., a signal of the H level (i.e., a signal, outputted from the overcurrent detector 22, which indicates the overcurrent state) is inputted to an input section of the control section 21). In such a case, the communication terminal 73 of the BP 70 is directly connected to the control section 21. When the BP 70 is attached to the game apparatus 80 and the power supply of the game apparatus 80 is turned on, the MPU 11 included in the game apparatus 80 directly transmits a control signal indicating the overcurrent state to the control section 21 of the BP 70 through the communication terminal 73 (in other words, a signal for emulating the overcurrent state is transmitted). As such, a signal for switching the BP 70 to a protection state is directly transmitted to the control section 21, thereby causing the control section 21 to recognize that the BP 70 is in the protection state, and to measure the aforementioned unresponsive time and return delay time. Thus, it becomes possible to more safely perform an operation of determining whether or not the BP 70 satisfies the safety specification.

While the invention has been described in detail, the foregoing description is in all aspects illustrative and not restrictive. It is understood that numerous other modifications and variations can be devised without departing from the scope of the invention.

What is claimed is:

1. An electrical apparatus which is connected to a power supply apparatus, the electrical apparatus comprising:
    a circuit section operable to pass a current to the power supply apparatus;
    a first current drawing section for drawing, before the current starts to pass between the power supply apparatus and the circuit section after the power supply apparatus has been connected, a current greater than or equal to a first predetermined value from the power supply apparatus;
    a first determination section for determining whether the output of the power supply apparatus is stopped when the first time period has passed from a time at which the first current drawing section starts to draw the current greater than or equal to the first predetermined value from the power supply apparatus, and
    an operation start section for causing a current to start to pass between the power supply apparatus and the circuit section to cause the circuit section to start to operate after the first determination section has determined that the output of the power supply apparatus has been stopped.

2. The electrical apparatus according to claim 1, wherein the first predetermined value is a current value obtained when the power supply apparatus starts an overcurrent protection operation, and
    the first time period is an unresponsive time set for the overcurrent protection operation performed by the power supply apparatus.

3. The electrical apparatus according to claim 2, wherein the first determination section determines that the output of the power supply apparatus is stopped before at least an allowable maximum time of the first time period has passed, from the time at which the first current drawing section starts to draw the current greater than or equal to the first predetermined value from the power supply apparatus.

4. The electrical apparatus according to claim 3, wherein the first determination section determines that the output of the power supply apparatus is stopped in a time period from when an allowable minimum time of the first time period has passed to when the allowable maximum time of the first time period has passed, from the time at which the first current drawing section starts to draw the current greater than or equal to the first predetermined value from the power supply apparatus.

5. The electrical apparatus according to claim 1, wherein the power supply apparatus is a battery pack,
    the electrical apparatus is an information processing apparatus which is operated by using an electric power supplied from the battery pack, and the first current drawing section and the first determination section are operable to pass a current to the battery pack, and are operated by using the electric power outputted from the battery pack.

6. An electrical apparatus according to claim 1, wherein the power supply apparatus is an AC adapter,
the electrical apparatus is an information processing apparatus which is operated by using an electric power supplied from the AC adapter, and
the first current drawing section and the first determination section are operable to pass a current to the AC adapter, and are operated by using the electric power outputted from the AC adapter.

7. An electrical apparatus according to claim 1, wherein the power supply apparatus is an AC adapter,
the electrical apparatus is a recharger for recharging a battery pack, or an information processing apparatus having a circuit for recharging the battery pack, and
the first current drawing section and the first determination section are operable to pass a current to the AC adapter, and recharge the battery pack by using an electric power outputted from the AC adapter, after the first determination section determines that the output of the power supply apparatus is stopped when the first time period has passed from the time at which the first current drawing section starts to draw the current greater than or equal to the first predetermined value from the power supply apparatus.

8. The electrical apparatus according to claim 1, wherein the power supply apparatus is a battery pack,
the electrical apparatus is a recharger for recharging the battery pack, or an information processing apparatus having a circuit for recharging the battery pack, and
the first current drawing section and the first determination section are operable to pass a current to the battery pack.

9. An electrical apparatus according to claim 1, further comprising a second current drawing section for drawing a current smaller than the first predetermined value for a predetermined time period, wherein
the first determination section further determines whether the output of the power supply apparatus is not stopped within the predetermined time period.

10. The electrical apparatus according to claim 1, wherein the power supply apparatus further comprises a return section for restarting the output of the power supply apparatus when a predetermined condition regarding a current or a voltage of the power supply apparatus is satisfied, after the output of the power supply apparatus is stopped,
the electrical apparatus further comprises a return current drawing section for drawing a return current from the power supply apparatus so as to satisfy the predetermined condition, after the output of the power supply apparatus is stopped; and
a second determination section for determining whether the output of the power supply apparatus is restarted after at least a second time period has passed from a time at which the return current drawing section starts to draw the return current from the power supply apparatus, and
after the first determination section determines that the output
of the power supply apparatus is stopped before the first time period has passed, and the second determination section further determines that the output of the power supply apparatus is restarted after the second time period has passed, the electrical apparatus starts to pass the current between the power supply apparatus and the circuit section so as to operate the circuit section.

11. The electrical apparatus according to claim 1, wherein the power supply apparatus further comprises a return section for restarting the output of the power supply apparatus when a predetermined condition regarding a current or a voltage of the power supply apparatus is satisfied, after the output of the power supply apparatus is stopped,
the electrical apparatus further comprises a return current drawing section for drawing a return current from the power supply apparatus so as to satisfy the predetermined condition, after the output of the power supply apparatus is stopped; and
a second determination section for determining whether the output of the power supply apparatus is restarted when a second time period has passed from a time at which the return current drawing section starts to draw the return current from the power supply apparatus, and
after the first determination section determines that the output of the power supply apparatus is stopped when the first time period has passed, and the second determination section further determines whether the output of the power supply apparatus is restarted when the second time period has passed, the electrical apparatus starts to pass the current between the power supply apparatus and the circuit section so as to operate the circuit section.

12. The electrical apparatus according to claim 1, wherein the power supply apparatus further comprises:
a memory section for storing a parameter regarding the first time period;
a first communication terminal for performing a communication with the electrical apparatus; and
a change section for changing the parameter stored in the memory section in accordance with a predetermined control signal transmitted from the electrical apparatus through the first communication terminal, and
the electrical apparatus further comprises:
a second communication terminal for performing a communication with the power supply apparatus when the electrical apparatus is connected to the power supply apparatus; and
a change instruction section for transmitting the predetermined control signal to the power supply apparatus through the second communication terminal, before the first current drawing section starts to pass the current between the power supply apparatus and the circuit section.

13. An electrical apparatus system having an electrical apparatus which is connected to a power supply apparatus and an electrical apparatus connected to the power supply apparatus, wherein
the electrical apparatus comprises:
a circuit section operable to pass a current to the power supply apparatus;
a first current drawing section for drawing, before the current starts to pass between the power supply apparatus and the circuit section after the power supply apparatus has been connected, a current greater than or equal to the first value from the power supply apparatus;
a first determination section for determining whether the output of the power supply apparatus is stopped when the first time period has passed from a time at which the first current drawing section starts to draw the current greater than or equal to the first value from the power supply apparatus;

an operation start section for causing a current to start to pass between the power supply apparatus and the circuit section to cause the circuit section to start to operate after the first determination section has determined that the output of the power supply apparatus has been stopped, wherein the electrical apparatus further comprises a control signal transmitting section for transmitting a predetermined control signal to the power supply apparatus, when the first determination section detects that the output of the power supply apparatus is stopped when the first time period has passed, wherein the power supply apparatus is operable to switch an operation mode between a first mode, in which it is determined that the current greater than or equal to the first predetermined value passes for the first time period and the output of the power supply apparatus is stopped, and a second mode, in which the it is detected that a current greater than or equal to a second predetermined value passes for a second time period and the output of the power supply apparatus is stopped, and the power supply apparatus is in the first mode before receiving the control signal, and is in the second mode after receiving the control signal.

14. The electrical apparatus system according to claim 13, wherein the power supply apparatus further comprises a connection state detection section for detecting a state in which the power supply apparatus is connected to the electrical apparatus, and when the connection state detection section detects that the power supply apparatus is not connected to the electrical apparatus, the power supply apparatus causes the output stopping section to be in the first mode.

15. The electrical apparatus system according to claim 13, wherein the power supply apparatus further comprises a reduction section for reducing a current, and before receiving the control signal, the power supply apparatus causes the output stopping section to be in the first mode and activates the reduction section, and after receiving the control signal, the power supply apparatus causes the output stopping section to be in the second mode and inactivates the reduction section.

\* \* \* \* \*